(12) United States Patent
Ichinomiya et al.

(10) Patent No.: US 8,271,117 B2
(45) Date of Patent: Sep. 18, 2012

(54) FABRICATION SYSTEM OF SEMICONDUCTOR INTEGRATED CIRCUIT, FABRICATION DEVICE, FABRICATION METHOD, INTEGRATED CIRCUIT AND COMMUNICATION SYSTEM

(75) Inventors: Takahiro Ichinomiya, Osaka (JP); Takashi Hashimoto, Hyogo (JP)

(73) Assignee: Panasonic Corporation, Osaka (JP)

( * ) Notice: Subject to any disclaimer, the term of this patent is extended or adjusted under 35 U.S.C. 154(b) by 497 days.

(21) Appl. No.: 12/523,834

(22) PCT Filed: Nov. 14, 2008

(86) PCT No.: PCT/JP2008/003329
§ 371 (c)(1),
(2), (4) Date: Sep. 22, 2009

(87) PCT Pub. No.: WO2009/066431
PCT Pub. Date: May 28, 2009

(65) Prior Publication Data
US 2010/0100219 A1    Apr. 22, 2010

(30) Foreign Application Priority Data
Nov. 22, 2007    (JP) .................................. 2007-302668

(51) Int. Cl.
*G06F 17/50*    (2006.01)
(52) U.S. Cl. ......... 700/104; 700/121; 716/108; 365/211
(58) Field of Classification Search .................. 700/104, 700/121; 716/108; 365/211
See application file for complete search history.

(56) References Cited

U.S. PATENT DOCUMENTS

| 4,713,792 | A | 12/1987 | Hartmann et al. |
| 4,774,421 | A | 9/1988 | Hartmann et al. |
| 6,661,724 | B1 * | 12/2003 | Snyder et al. ................. 365/211 |
| 7,257,789 | B2 | 8/2007 | Hosono et al. |
| 2005/0278672 | A1 * | 12/2005 | Hosono et al. .................... 716/6 |

FOREIGN PATENT DOCUMENTS

| JP | 54-125376 | 9/1979 |
| JP | 61-284936 | 12/1986 |
| JP | 2004-246538 | 9/2004 |
| JP | 2005-352916 | 12/2005 |

OTHER PUBLICATIONS

International Search Report issued Dec. 9, 2008 in the International (PCT) Application of which the present application is the U.S. National Stage.

* cited by examiner

*Primary Examiner* — Tejal Gami
(74) *Attorney, Agent, or Firm* — Wenderoth, Lind & Ponack, L.L.P.

(57) ABSTRACT

A manufacturing system which can restrain the margin of a semiconductor integrated circuit. The integrated circuit including a fixed circuit unit and a reconfigurable circuit unit outputs, to a configuration determining server, an operation time which was calculated by a detecting unit and a calculating unit. The configuration determining server, by using the operation time obtained from the integrated circuit, calculates performance data which indicates the characteristics of the fixed circuit unit, selects, based on the performance data, a piece of configuration information indicating a circuit configuration that is optimum for the processing of the reconfigurable circuit unit, and outputs the selected piece of configuration information. The integrated circuit builds a circuit in the reconfigurable circuit unit in accordance with the output piece of configuration information.

11 Claims, 16 Drawing Sheets

FABRICATION SYSTEM OF SEMICONDUCTOR INTEGRATED CIRCUIT, FABRICATION DEVICE, FABRICATION METHOD, INTEGRATED CIRCUIT AND COMMUNICATION SYSTEM

TECHNICAL FIELD

The present invention relates to a manufacturing system of a semiconductor integrated circuit, especially to a system for building a circuit in a reconfigurable circuit unit mounted on the semiconductor integrated circuit.

BACKGROUND ART

In a semiconductor integrated circuit, a voltage drop occurs when an electric current flows. When this happens, the operation time changes depending on the amount of voltage drop. In the present description, a time period required for performing a one cycle of process in the semiconductor integrated circuit, from a time when an input signal is input to a time when an output signal is output after executing a predetermined processing, is called operation time. The operation time arises out of the propagation delay of each element constituting the semiconductor integrated circuit. Note that a long operation time may be referred to as "the operation speed of the circuit is slow"; and a short operation time maybe referred to as "the operation speed is fast".

In the actual manufacturing, the manufactured products may differ in manufacturing characteristics depending on the manufacturing processes or the quality of the material. For example, some manufactured products may have a longer or shorter operation time than a design target value that is set at the design phase.

Patent Document 1 identified below discloses a technology for designing a semiconductor integrated circuit by setting margins so that a normal operation can be ensured even if the operation time exceeds the design target value.

Patent Document 1: Japanese Patent Application Publication No. 2005-3529916

SUMMARY OF THE INVENTION

The Problems the Invention is Going to Solve

To manufacture the products that operate normally even if they differ in manufacturing characteristics depending on the manufacturing processes or the quality of the material, it is necessary to determine a design margin based on an estimated level of deviation from the design target value.

The design margin may be determined, for example, by estimating a case where the operation time is the longest. When the design margin is determined in this way, an excessive margin is set for some semiconductor integrated circuits that can operate faster than the design target value (namely, circuits having a short operation time), which makes waste in circuit area or the like.

Conversely, when a small margin is set, the completed semiconductor integrated circuits may not operate normally due to variations of manufacturing characteristics to the products.

In view of the above-described problems, an object of the present invention is to provide a manufacturing system, manufacturing method, and manufacturing device for manufacturing, while restraining the design margin not to be excessive, a semiconductor integrated circuit which operates as designed even if the manufacturing characteristics of the products vary due to the manufacturing processes or the like, also to provide the semiconductor integrated circuit and a communicating system.

Means to Solve the Problems

The above-mentioned object of the present invention can be fulfilled by a manufacturing system comprising a semiconductor integrated circuit and a manufacturing device, the semiconductor integrated circuit being a semifinished product, the manufacturing device manufacturing a finished product by outputting appropriate configuration information to the semiconductor integrated circuit, wherein the semiconductor integrated circuit includes a programmable circuit and a fixed circuit, and the manufacturing device includes: a storage unit storing a plurality of pieces of candidate configuration information and a plurality of pieces of first voltage information, where the plurality of pieces of candidate configuration information define respective configurations of a plurality of candidate circuits that have the same function but different configurations when configured in the programmable circuit, the plurality of pieces of first voltage information indicating voltage changes that are expected to arise in the programmable circuit when the plurality of candidate circuits operate respectively; an obtaining unit operable to obtain one or more measured values of voltage changes measured in the semiconductor integrated circuit, from the semiconductor integrated circuit which is operating at least partially; a generating unit operable to generate, based on the obtained measured values, second voltage information that indicates a voltage change that arises in the fixed circuit as the fixed circuit operates; a calculating unit operable to obtain, by combining the second voltage information and each of the plurality of pieces of first voltage information for each of the plurality of candidate circuits, third voltage information that indicates a change in a voltage drop value, the voltage drop value being a difference between a designed reference voltage and a voltage that arises in the semiconductor integrated circuit when both the fixed circuit and the programmable circuit operate, and calculate a maximum voltage drop value from the obtained third voltage information; a selecting unit operable to detect one or more candidate circuits corresponding to maximum voltage drop values that are smaller than a threshold value, and select, as output configuration information, one among one or more pieces of candidate configuration information defining configurations of the detected candidate circuits; and an output unit operable to output the selected output configuration information to the semiconductor integrated circuit.

The above-mentioned object of the present invention can also be fulfilled by a manufacturing device for manufacturing a finished product by outputting appropriate configuration information to a semiconductor integrated circuit which is a semifinished product including a programmable circuit and a fixed circuit, the manufacturing device comprising: a storage unit storing a plurality of pieces of candidate configuration information and a plurality of pieces of first voltage information, where the plurality of pieces of candidate configuration information define respective configurations of a plurality of candidate circuits that have the same function but different configurations when configured in the programmable circuit, the plurality of pieces of first voltage information indicating voltage changes that are expected to arise in the programmable circuit when the plurality of candidate circuits operate respectively; an obtaining unit operable to obtain one or more measured values of voltage changes measured in the semiconductor integrated circuit, from the semiconductor integrated circuit which is operating at least partially; a generating unit operable to generate, based on the obtained measured values, second voltage information that indicates a voltage change that arises in the fixed circuit as the fixed circuit operates; a calculating unit operable to obtain, by combining the second voltage information and each of the plurality of pieces of first voltage information for each of the plurality of candidate circuits, third voltage information that indicates a change in a voltage drop value, the voltage drop value being a difference between a designed reference voltage and a voltage that arises in the semiconductor integrated circuit when both the fixed circuit and the programmable circuit operate, and calculate a maximum voltage drop value from the obtained third voltage information; a selecting unit operable to detect one or more candidate circuits corresponding to maximum voltage drop values that are smaller than a threshold value, and select, as output configuration information, one among one or more pieces of candidate configuration information defining configurations of the detected candidate circuits; and an output unit operable to output the selected output configuration information to the semiconductor integrated circuit.

Note that each element of the above-described structure corresponds to each element disclosed in Embodiment 4. Also, in Embodiments 1 through 3 described below, the above-described "semiconductor integrated circuit" corresponds to the integrated circuit 3000. Further, "programmable circuit" corresponds to the reconfigurable circuit unit 3004, and "fixed circuit" corresponds to the fixed circuit unit 3003. Further, "manufacturing device" corresponds to the configuration determining server 3007. Further, "storage unit" corresponds to the reconfigurable circuit waveform storage unit 1012 and the internal memory of the combined waveform generating unit 3018, the obtaining unit corresponds to the interface provided in the configuration determining server, "generating unit" corresponds to the fixed circuit waveform estimating unit 3013, "calculating unit" corresponds to the combined waveform generating unit 3018 and the maximum voltage drop value detecting unit 3019. The "selecting unit" corresponds to the comparing unit 3021 and the judging unit 3023. The "output unit" corresponds to the judging unit 3023 and the interface of the configuration determining server. Also, "first voltage information" described above corresponds to the reconfigurable circuit unit estimated waveform 2002, 2005, ... shown in FIG. 7 of Embodiment 1. The "second voltage information" corresponds to the fixed circuit unit estimated waveform 2001.

EFFECTS OF THE INVENTION

With the above-described structure, the selecting unit selects, from a plurality of pieces of candidate configuration information, a piece of candidate configuration information that indicates a candidate circuit whose maximum voltage drop value is smaller than the threshold value when both the fixed circuit and the programmable circuit operate. Accordingly, the completed semiconductor integrated circuit operates correctly even if the manufacturing characteristics deviate from the design target value.

That is to say, even if the fixed circuits have different characteristics, it is possible to select, from a plurality Of candidate circuits, a candidate circuit that suits to the characteristics of the fixed circuits, and build the selected candidate circuit in the programmable circuit. This structure produces an advantageous effect that it is possible to manufacture a semiconductor integrated circuit that operates correctly even if the individual fixed circuits have different characteristics.

In the above-stated manufacturing system, the obtaining unit may obtain, as the one or more measured values, a plurality of voltage values that were measured at prescribed intervals in the semiconductor integrated circuit in operation, and the generating unit generates the second voltage information by complementing between the obtained plurality of voltage values.

With the above-described structure, the generating unit generates the second voltage information by complementing between the obtained plurality of voltage values. That is to say, since the second voltage information is a set of voltage values, the calculating unit can obtain the third voltage information using subtraction which is a simple calculation, and calculate the maximum voltage drop value easily by comparing among a plurality of voltage drop values making up the third voltage information.

In the above-stated manufacturing system, the obtaining unit may obtain, as the one or more measured values, operation times that were measured in the semiconductor integrated circuit in operation, and the generating unit includes: a storage unit storing first prediction information indicating a voltage change that is expected to arise in the fixed circuit when the fixed circuit operates with a first operation time, and second prediction information indicating a voltage change that is expected to arise in the fixed circuit when the fixed circuit operates with a second operation time; and an information generating unit operable to generate the second voltage information by complementing between the first prediction information and the second prediction information, using the obtained operation times.

Note that one of the above-mentioned "first and second prediction information" is the voltage drop waveform 1022 shown in FIG. 4, and the other is either the voltage drop waveform 1021 or the voltage drop waveform 1023. It is determined which of the voltage drop waveform 1021 and the voltage drop waveform 1023 should be used as "the other prediction information", based on the "measured values (the performance data described in the embodiments)".

Also, the operation time correlates with the voltage drop value. Here, the operation time is, as described above, a time period of one cycle in the semiconductor integrated circuit, from a time when an input signal is input to a time when an output signal is output. According to the above-described structure, the generating unit stores the first and second prediction information. Therefore, the generating unit can generate the second voltage information when the obtaining unit obtains the operation time.

In the above-stated manufacturing system, the obtaining unit may obtain, as the one or more measured values, a plurality of voltage drop values that are measured at prescribed intervals in the semiconductor integrated circuit in operation and that gets voltage drop values from the reference voltage, and the generating unit generates the second voltage information by complementing between the obtained plurality of voltage drop values.

With the above-described structure, the generating unit generates the second voltage information by complementing between the obtained plurality of voltage drop values. That is to say, the second voltage information is a set of voltage drop values, and is substantially equal to the third voltage information.

Therefore, the calculating unit can easily obtain the third voltage information from the generating unit, and calculate the maximum voltage drop value easily by comparison which is a simple calculation.

The above-stated manufacturing system may further comprise: a prediction information storage unit storing, for one of the candidate circuits, first prediction information indicating a voltage change with time that is expected to arise in the programmable circuit when the one of the candidate circuits operates with a first operation time; a prediction information generating unit operable to generate second prediction information indicating a voltage change when the one of the candidate circuits operates with a second operation time, by increasing and/or decreasing the first prediction information in a time axis direction and in a voltage change axis direction, using the first operation time; a voltage information generating unit operable to generate the first voltage information by complementing between the first prediction information and the second prediction information, using the obtained measured values; and a recording unit operable to record the first voltage information into the storage unit.

In the above-stated manufacturing system, the prediction information generating unit may generate the second prediction information so that an integration value for entire prediction interval of the first prediction information corresponds to an integration value for entire prediction interval of the second prediction information.

Note that the above-mentioned "prediction information generating unit" corresponds to the simulation unit described in the embodiments below. The "first prediction information-"corresponds to, for example, the voltage drop waveform 4008 shown in FIG. 6 in Embodiment 1. The "second prediction information"corresponds to either the voltage drop waveform 4002 or the voltage drop waveform 4004. It is determined which of the voltage drop waveform 4002 and the voltage drop waveform 4004 should be used as "the second prediction information", based on the "measured values (the performance data described in the embodiments)".

With the above-described structure, the prediction information generating unit generates the second prediction information by increasing and/or decreasing the first prediction information in the two time axis directions, using the operation time. This makes it necessary for the manufacturing device to store only one piece, not all pieces, of prediction information, where generally the prediction information is large in data size, thus reducing the storage capacity.

In the above-stated manufacturing system, when there are a plurality of maximum voltage drop values that are smaller than a threshold value, the selecting unit may select, as the output configuration information, one of the one or more pieces of candidate configuration information that corresponds to the smallest one among the maximum voltage drop values.

The above-described structure produces an advantageous effect that the maximum voltage drop value of the finished integrated circuit has a lower possibility of causing an excessive current than in the case where any of the other candidate circuits is built.

The above-mentioned object of the present invention can also be fulfilled by a communication system comprising an information terminal device and a server device, wherein the information terminal device includes: a first communication unit; a semiconductor integrated circuit including a programmable circuit and a fixed circuit; and a writing unit operable to receive configuration information via the first communication unit, and write the received configuration information into the programmable circuit, and the server device includes: a second communication unit; a storage unit storing a plurality of pieces of candidate configuration information and a plurality of pieces of first voltage information, where the plurality of pieces of candidate configuration information define respective configurations of a plurality of candidate circuits that have the same function but different configurations when configured in the programmable circuit, the plurality of pieces of first voltage information indicating voltage changes that are expected to arise in the programmable circuit when the plurality of candidate circuits operate respectively; an obtaining unit operable to, in the information terminal device which is operating at least partially, obtain, from the semiconductor integrated circuit in operation via the second communication unit, one or more measured values of voltage changes measured in the semiconductor integrated circuit; a generating unit operable to generate, based on the obtained measured values, second voltage information that indicates a voltage change that arises in the fixed circuit as the fixed circuit operates; a calculating unit operable to obtain, by combining the second voltage information and each of the plurality of pieces of first voltage information for each of the plurality of candidate circuits, third voltage information that indicates a change in a voltage drop value, the voltage drop value being a difference between a designed reference voltage and a voltage that arises in the semiconductor integrated circuit when both the fixed circuit and the programmable circuit operate, and calculate a maximum voltage drop value from the obtained third voltage information; a selecting unit operable to detect one or more candidate circuits corresponding to maximum voltage drop values that are smaller than a threshold value, and select, as output configuration information, one among one or more pieces of candidate configuration information defining configurations of the detected candidate circuits; and an output unit operable to output the selected output configuration information to the semiconductor integrated circuit.

DESCRIPTION OF CHARACTERS 1 manufacturing system
3 communication system
1010 measured value storage unit
1011 fixed circuit waveform storage unit
1012 reconfigurable circuit waveform storage unit
2010 circuit board
3023 judging unit
3000 integrated circuit
3001 detecting unit
3002 calculating unit
3003 fixed circuit unit
3004 reconfigurable circuit unit
3005 configuration control unit
3006 configuration information storage unit
3007 configuration determining server
3011 performance data calculating unit
3013 fixed circuit waveform estimating unit
3017 reconfigurable circuit waveform estimating unit
3018 combined waveform generating unit
3019 maximum voltage drop value detecting unit
3021 comparing unit
3051 ring oscillator
3052 counter
3053 delay extracting unit
7001 portable information device
7002 configuration determining server
7010 measured value storage unit
7011 performance data calculating unit
7018 combined waveform generating unit
8000 manufacturing system
8100 semiconductor integrated circuit
8101 fixed circuit
8102 programmable circuit
8200 manufacturing device
8201 storage unit
8202 obtaining unit
8203 generating unit
8204 calculating unit
8205 selecting unit
8206 output unit

DETAILED DESCRIPTION OF THE INVENTION

1. Embodiment 1

The following describes a manufacturing system 1 as an embodiment of the present invention.

1.1 Outline

Figure 1:
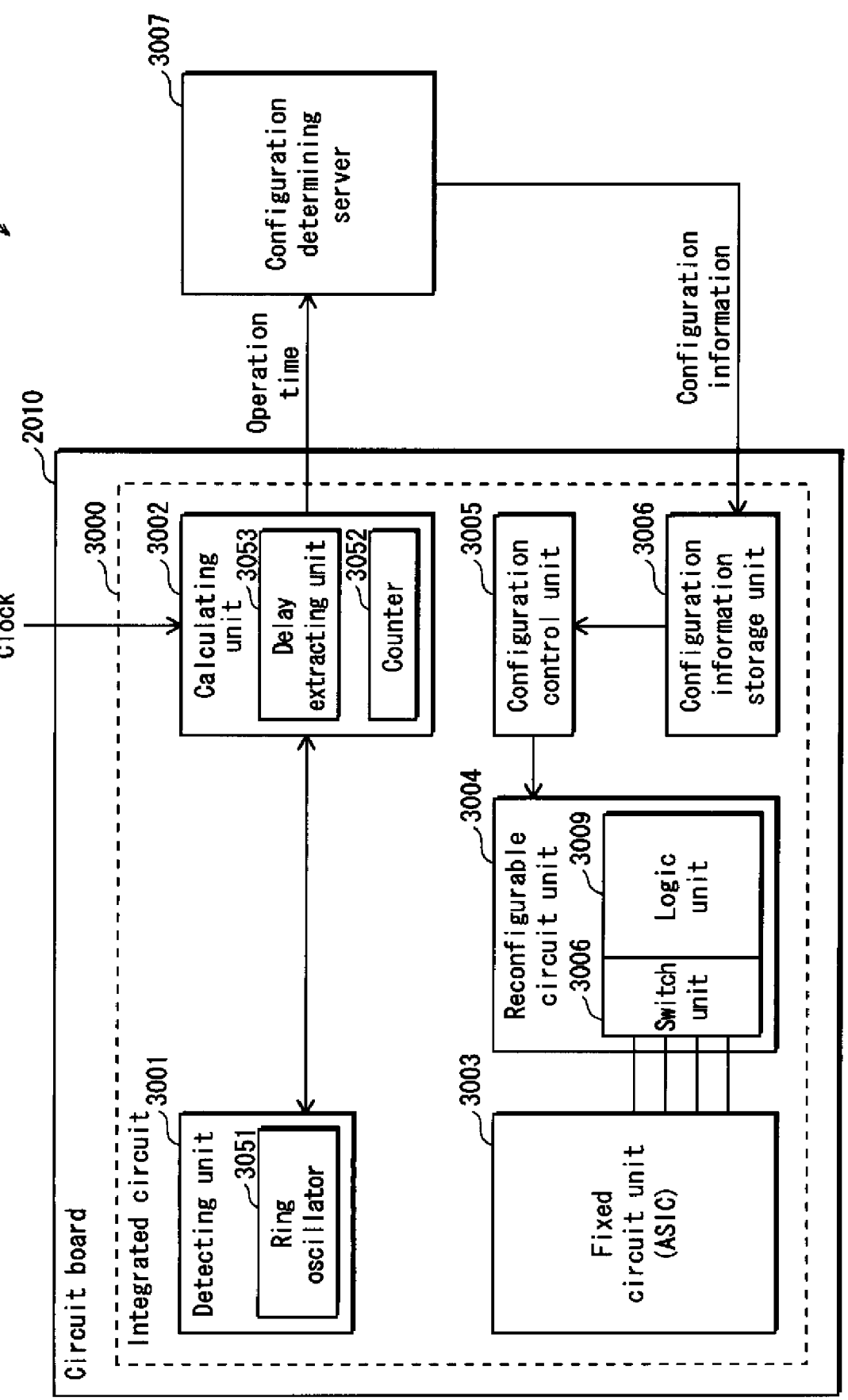
FIG. 1 shows the structure and data flow of the manufacturing system 1 in Embodiment 1.

FIG. 1 shows the structure of the manufacturing system 1 in Embodiment 1 of the present invention. In the manufacturing system 1, the structure of a circuit to be built in a reconfigurable circuit within an integrated circuit 3000 is determined, the determined circuit is output to the reconfigurable circuit, and the integrated circuit, upon receiving configuration information, builds the circuit in the reconfigurable circuit according to the configuration information.

As shown in FIG. 1, the detecting unit and the calculating unit in the integrated circuit 3000 measure the operation time in the fixed circuit unit, and outputs the measured operation time to a configuration determining server 3007.

As described above, the operation time arises out of the propagation delay of each element constituting the circuit. A long operation time may also be referred to as "the operation of a circuit is slow" or "the operation speed is slow"; and a short operation time may also be referred to as "the operation of a circuit is fast" or "the operation speed is fast".

The configuration determining server 3007 holds a plurality of pieces of configuration information which respectively indicate configurations of circuits having a function that is to be provided in the reconfigurable circuit unit (such that circuits having different configurations but the same function are built).

The configuration determining server 3007 calculates, from the obtained operation time, performance data which numerically represents the performance of the fixed circuit unit, and selects an optimum piece of configuration information from among the plurality of pieces of configuration information based on the calculated performance data.

Here, the "performance" means a characteristic of each of the manufactured integrated circuits. The performance arises depending on the manufacturing processes or the quality of the material of the circuit.

Also, the optimum piece of configuration information means that, when the integrated circuit 3000 is operated in the state where a circuit is built according to the piece of configuration information, the maximum voltage drop value is small.

The configuration determining server 3007 inputs the selected piece of configuration information into an input terminal of the circuit board. A circuit is built in the reconfigurable circuit unit according to the piece of configuration information being input into the integrated circuit via the input terminal.

Note that, although not specifically illustrated, a circuit board 2010 is provided with: a read mechanism for reading data from the integrated circuit 3000; and a write mechanism for writing data into storage elements within the integrated circuit 3000. Also, the configuration determining server 3007 is connectable with an input/output terminal of the circuit board, and is provided with an interface for receiving and sending data from/to the integrated circuit 3000.

1.2 Integrated Circuit 3000

As shown in FIG. 1, the integrated circuit 3000 includes a detecting unit 3001, a calculating unit 3002, a fixed circuit unit 3003, a reconfigurable circuit unit 3004, a configuration control unit 3005, and a configuration information storage unit 3006.

(1) Fixed Circuit Unit 3003 and Reconfigurable Circuit Unit 3004

The fixed circuit unit 3003 and a circuit built in the reconfigurable circuit unit 3004 are connected with each other and work in concert with each other so that the integrated circuit 3000 achieves the functions desired by the designer.

The fixed circuit unit 3003 is a circuit whose configuration cannot be changed.

On the other hand, the reconfigurable circuit unit 3004 is a circuit whose configuration can be changed after the manufacturing thereof. More specifically, the reconfigurable circuit unit 3004 is composed of circuits such as an FPGA, CPLD, and reconfigurable logic.

The reconfigurable circuit unit 3004 includes a switch unit 3008 and a logic unit 3009. The logic unit 3009 is area in which a circuit that actually performs operations is built. The switch unit 3008 is area in which a switch circuit is built to connect the fixed circuit unit 3003 with an input/output terminal of the circuit built on the logic unit 3009.

(2) Detecting Unit 3001 and Calculating Unit 3002

The detecting unit 3001, in the manufacturing process, outputs a signal indicating the characteristic of the fixed circuit unit 3003 to the calculating unit 3002.

In Embodiment 1, the detecting unit 3001 is composed of a ring oscillator 3051 that is implemented on the fixed circuit unit 3003 side thereof.

The calculating unit 3002 calculates data indicating the ring oscillator characteristics, based on the signal obtained from the detecting unit 3001.

More specifically, the calculating unit 3002 includes a counter 3052 and a delay extracting unit 3053 which calculate the operation time of the ring oscillator 3051. It should be noted here that the operation time is one example of the data that indicates characteristics, and other types of data may be calculated.

Figure 2:
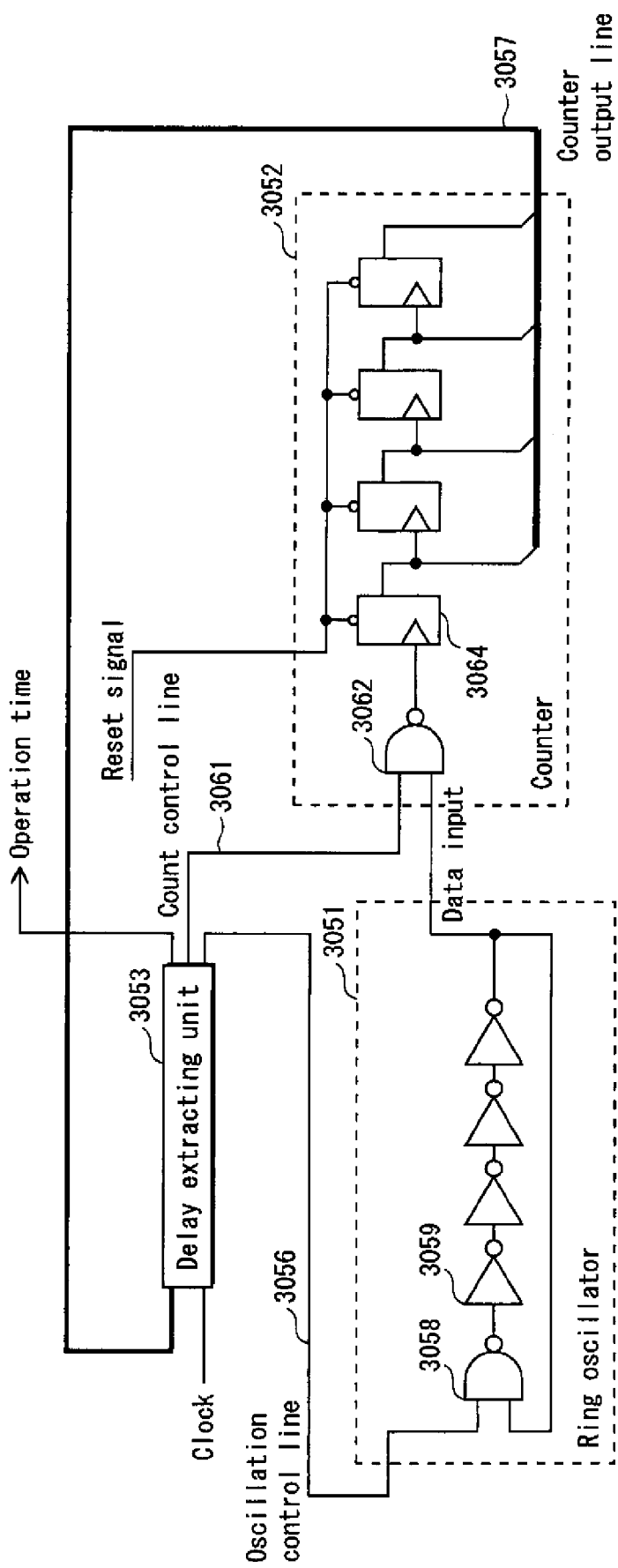
FIG. 2 is a circuit diagram showing a detailed structure of the detecting unit 3001 and the calculating unit 3002.

FIG. 2 shows one example of a detailed structure of the ring oscillator 3051 constituting the detecting unit 3001, and the counter 3052 and the delay extracting unit 3053 constituting the calculating unit 3002.

As shown in FIG. 2, the ring oscillator 3051 is structured by circularly connecting an NAND circuit 3058 and a plurality of NOT circuits 3059. The NAND circuit 3058 is provided with two inputs, one of which is a circularly-connected signal line, and the other is an oscillation control line 3056 that is an output from the delay extracting unit 3053. The ring oscillator 3051 is also connected with an input terminal of the counter 3052.

The counter 3052 is structured by connecting an NAND circuit 3062 and a plurality of flip-flop circuits 3064. A counter output line 3057 from the counter 3052 is connected with the delay extracting unit 3053.

The delay extracting unit 3053 receives, as inputs, a clock and a counter value measured by the counter 3052. Also, the delay extracting unit 3053 is connected with an input terminal of the counter 3052 via a count control line 3061.

Now a description is given of the procedure for extracting a delay value by the above-described structure.

First, the delay extracting unit 3053 causes the ring oscillator 3051 to start oscillating, by enabling the oscillation control line 3056. The counter 3052 is reset after the operation of the ring oscillator 3051 is stabilized.

The delay extracting unit 3053 keeps the oscillation control line 3056 enable for a predetermined time period (a time period determined by frequency-dividing the clock) after canceling the reset.

The ring oscillator 3051 generates oscillation.

During the above-mentioned predetermined time period, the counter 3052 counts the number of oscillations of signals output from the ring oscillator 3051, and outputs a "counter value" to the delay extracting unit 3053.

After the predetermined time period passes, the delay extracting unit 3053 calculates a value by dividing "predetermined time" by the counter value. The value (delay value of one cycle period) calculated here indicates a time period taken by a signal to circle the ring oscillator 3051.

By the above-described procedure, the detecting unit 3001 and the calculating unit 3002 calculate the operation time (delay value of one cycle period) of the ring oscillator 3051.

Here, the following should be taken into account. That is to say, components of one integrated circuit are estimated to have similar characteristics since they are through the same manufacturing processes. Especially, the components are estimated to have more similar characteristics when they are closer to each other on the integrated circuit 3000. In view of this, in the present embodiment, the characteristics of the fixed circuit unit 3003 are replaced with the characteristics of the ring oscillator 3051 that is implemented in the vicinity of the fixed circuit unit 3003.

Note that it is also possible to calculate data that indicates characteristics of the fixed circuit more accurately, by obtaining characteristics of the wiring and various types of transistors respectively with use of a plurality of ring oscillators.

(3) Configuration Information Storage Unit 3006

The configuration information storage unit 3006 is composed of nonvolatile or volatile storage medium.

The configuration information storage unit 3006 stores configuration information output from the configuration determining server 3007.

(4) Configuration Control Unit 3005

The configuration control unit 3005 reads out the configuration information from the configuration information storage unit 3006, decodes the read-out information, and outputs the decoded configuration information to the reconfigurable circuit unit 3004, thereby enabling the reconfigurable circuit unit 3004 to build a circuit.

1.3 Configuration Determining Server 3007

Figure 3:
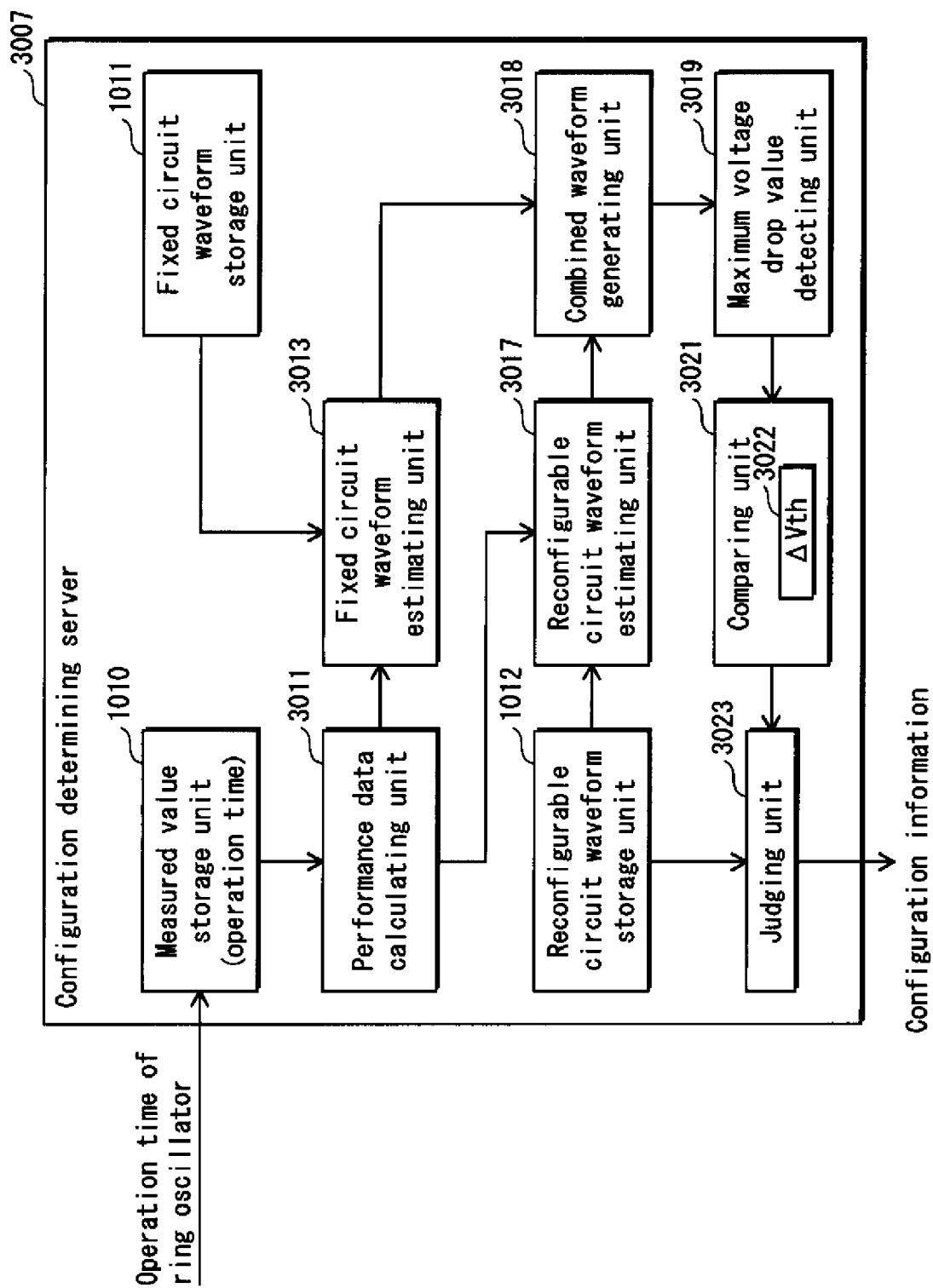
FIG. 3 is a block diagram showing a functional structure of the configuration determining server 3007.

FIG. 3 is a block diagram showing a functional structure of the configuration determining server 3007. As shown in FIG. 3, the configuration determining server 3007 includes a measured value storage unit 1010, a fixed circuit waveform storage unit 1011, a reconfigurable circuit waveform storage unit 1012, a performance data calculating unit 3011, a fixed circuit waveform estimating unit 3013, a reconfigurable circuit waveform estimating unit 3017, a combined waveform generating unit 3018, a maximum voltage drop value detecting unit 3019, a comparing unit 3021, and a judging unit 3023. Note that, although not illustrated, the configuration determining server 3007 further includes an input unit for receiving instruction or data input from the operator, a monitor for displaying a result of judgment by the judging unit 3023, and an interface to which the manufacturing-target circuit board 2010 is attached.

The configuration determining server 3007 is more specifically a computer system including a microprocessor, a RAM, and a ROM. A computer program is recorded in the RAM and ROM. The configuration determining server 3007 achieves part of its functions as the microprocessor operates in accordance with the computer program.

Note that the above-described structure is merely one example, and those parts or all of the configuration determining server 3007 may be constituted from dedicated hardware for achieving the configuration determination function.

The following describes the manufacturing system 1 as one embodiment of the present invention.

(1) Measured Value Storage Unit 1010

The measured value storage unit 1010 is composed of a nonvolatile or volatile storage medium. The measured value storage unit 1010 receives an operation time tm of the ring oscillator, and temporarily stores the received operation time tm. When storing a plurality of operation times in correspondence with a plurality of integrated circuits, the measured value storage unit 1010 stores the operation times in correspondence with serial numbers and the like that uniquely identify the integrated circuits.

(2) Performance Data Calculating Unit 3011

Note that, in the following description, the design target value for each parameter is merely referred to as "design target value".

The performance data calculating unit 3011 stores a design target value tp of the operation time of the ring oscillator 3051. The design target value tp is a one-cycle operation time of the ring oscillator that is estimated at the design phase from the quality of the assumed material, manufacturing processes, use situation, physical structure of the ring oscillator and the like.

Note that, although a one-cycle operation time of the ring oscillator is used in this example, the present invention is not limited to the one-cycle operation time. For example, an operation time per NOT circuit may be obtained by dividing the one-cycle operation time by the number of NOT circuits constituting the ring oscillator.

The performance data calculating unit 3011 reads out the operation time tm from the measured value storage unit 1010, and calculates a ratio tm/tp that is a ratio of the operation time tm to the design target value tp. The performance data calculating unit 3011 outputs, as the performance data, the calculated value tm/tp to the fixed circuit waveform estimating unit 3013 and the reconfigurable circuit waveform estimating unit 3017.

As described above, in the present embodiment, the characteristics of the fixed circuit unit 3003 are replaced with the characteristics of the ring oscillator. Accordingly, the calculated performance data tm/tp can be regarded as data that indicates the characteristics of the fixed circuit unit 3003.

Note that, in the above description, the performance data calculating unit 3011 calculates, as the performance data, a ratio between the actual operation time and design target value. However, it is merely one example, but the performance data may be determined by other calculations. For example, a difference between the design target value and measured value may be calculated.

(3) Fixed Circuit Waveform Storage Unit 1011

The fixed circuit waveform storage unit 1011 is composed of a nonvolatile storage medium.

The fixed circuit waveform storage unit 1011 stores a plurality of voltage drop waveforms in one cycle of operation of the fixed circuit unit 3003. The plurality of voltage drop waveforms are all theoretical ones that are obtained by performing simulations by using varied parameters indicating manufacturing conditions or operational conditions.

Figure 4:
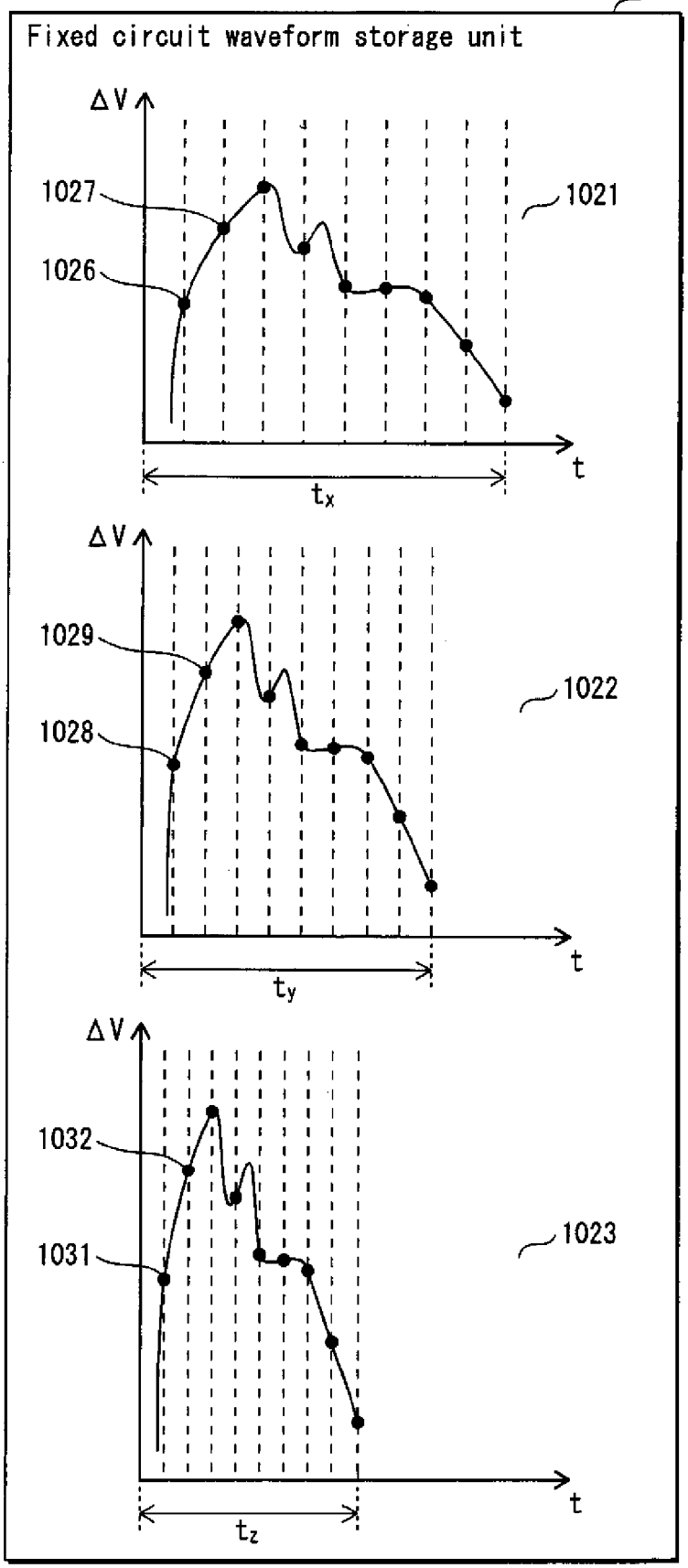
FIG. 4 shows one example of the data stored in the fixed circuit waveform storage unit 1011.

FIG. 4 shows one example of the data stored in the fixed circuit waveform storage unit 1011. As shown in FIG. 4, the fixed circuit waveform storage unit 1011 stores three voltage drop waveforms 1021, 1022 and 1023. In these graphs, the horizontal axis represents the time, and the vertical axis represents the voltage drop value.

The voltage drop waveform 1022 is a voltage drop waveform of the integrated circuit 3000 that is obtained by performing a simulation by using parameters set to the manufacturing conditions and operational conditions as designed, and the operation time ty is equal to the design target value.

The voltage drop waveform 1021 is a voltage drop waveform that is obtained by performing a simulation by using parameters that are set so that the operation time is longer than the design target value.

The voltage drop waveform 1023 is a voltage drop waveform that is obtained by performing a simulation by using parameters that are set so that the operation time is shorter than the design target value.

Note that in this example, the simulations are performed such that each of operation times tx, ty and tz is equal to or smaller than the time of one cycle of the clock (tcl). That is to say, the condition tz<ty<tx≦tcl is satisfied. Note that this condition is merely one example and may not necessarily be satisfied.

These voltage drop waveforms are generated by a simulation unit (not illustrated) and are stored into the fixed circuit waveform storage unit 1011 by the time a configuration information selection process (which will be described later) is started. In the simulation and an approximate calculation (which will be described later) performed by the simulation unit, data indicating the structure of the fixed circuit unit 3003 and characteristics is input by the operator.

Meanwhile, although it is possible to perform a simulation by setting different parameters respectively for the voltage drop waveforms 1021, 1022 and 1023, but such a simulation takes time. In view of this, only the voltage drop waveform 1022 may be obtained through a simulation, and the voltage drop waveforms 1021 and 1023 may be estimated by performing approximate calculations on the voltage drop waveform 1022, respectively.

Now, a description is given of an estimation method as one example, although there are a variety of such estimation methods.

The voltage drop waveform can be generated in an interpolating manner depending on the performance of the transistor in speed. For example, under the assumption that the transistor operates faster than the design target value, the simulation unit calculates the operation time of a critical path in the fixed circuit unit 3003. Then, the simulation unit determines an expansion in the time axis direction (operation time tz), depending on the operation time of the critical path. The simulation unit then reduces the voltage drop waveform 1022 in the time axis direction so that its operation time is equal to the determined operation time tz. Here, it is approximated that:

operation time=sum of operation time of each element, and delay time of each element=(ON resistance of transistor)×(load capacity of wiring).

It is also assumed here that the circuit load capacity (capacity of wiring and gates) does not change even if the transistors have different driving capability (saturated current amounts) depending on the manufacturing situation or operation condition. It is further assumed that a value obtained by integrating an amount of electric current with time is constant regardless of the manufacturing situation or operation condition. Furthermore, when it is assumed that the voltage drop value is proportional to the amount of electric current, a value obtained by integrating the voltage drop value with time is constant, as well.

Based on these, the simulation unit generates the voltage drop waveform 1023 by scaling down an voltage drop waveform in the time axis direction and then scaling up the result in the voltage drop value axis direction. In this generation of the voltage drop waveform 1023, scaling ratio is determined so that the integration value of the voltage drop waveform 1023 with time is equivalent to the integration value of the voltage drop waveform 1022 with time.

The voltage drop waveform 1021 is obtained by performing a similar calculation under the assumption that the operation speed of the transistor is slower than the designed value.

Note that, although it has been described that the fixed circuit waveform storage unit 1011 stores the curve charts shown in FIG. 4 for the sake of descriptive convenience, in the actuality, functions indicating charts or a plurality of coordinates indicating points on charts maybe stored as voltage drop waveforms.

The information shown in FIG. 4 is merely one example, and there is no limitation to the conditions under which the voltage drop waveforms stored in the fixed circuit waveform storage unit 1011 are. In the present embodiment, the fixed circuit waveform storage unit 1011 stores three voltage drop waveforms which respectively correspond to an operation time as designed, an operation time shorter than the design target value, and an operation time longer than the design target value so that estimation with higher accuracy can be made if a fixed circuit waveform estimating unit 3013 (which will be described later) interpolates errors.

Next, the fixed circuit waveform storage unit 1011 outputs the generated estimation waveforms to the combined waveform generating unit 3018.

(4) Fixed Circuit Waveform Estimating Unit 3013

Figure 5:
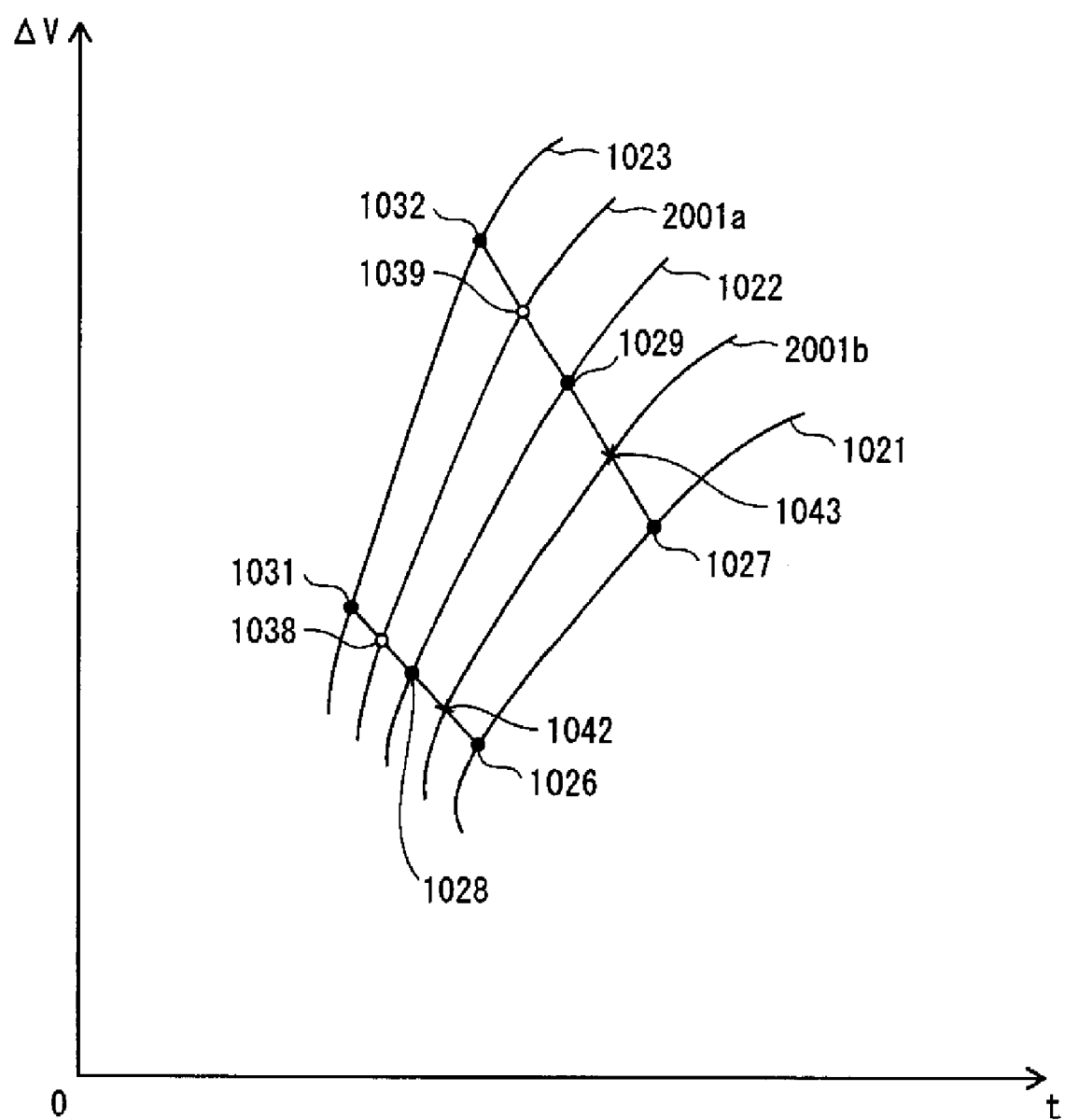
FIG. 5 shows parts of waveforms estimated by the fixed circuit waveform estimating unit 3013.

The fixed circuit waveform estimating unit 3013 receives performance data tm/tp. Receiving this, the fixed circuit waveform estimating unit 3013 reads out the voltage drop waveforms 1021, 1022 and 1023 from the fixed circuit waveform storage unit 1011, and estimates the voltage drop waveform of the fixed circuit unit 3003 by complementing waveforms between the read-out voltage drop waveforms. FIG. 5 shows enlargements of parts of the voltage drop waveforms 1021, 1022 and 1023. The following describes one example of the estimation method with reference to FIGS. 4 and 5.

First, the fixed circuit waveform estimating unit 3013 divides the operation time into n pieces (in FIG. 4, n=9) in each of the three voltage drop waveforms to determine n sections. Next, the fixed circuit waveform estimating unit 3013 specifies points each of which is located at a boundary between sections in a voltage drop waveform. For example, the fixed circuit waveform estimating unit 3013 specifies points 1026, 1027, . . . on the voltage drop waveform 1021 in ascending order of time. Similarly, the fixed circuit waveform estimating unit 3013 specifies points 1028, 1029, . . . on the voltage drop waveform 1022 and points 1031, 1032, . . . on the voltage drop waveform 1023.

Note that, as described earlier, the voltage drop waveforms stored in the fixed circuit waveform storage unit 1011 may be represented by a plurality of coordinates indicating points on charts. In this case, there is a possibility that the above-mentioned n pieces of points are not included in the plurality of points. In this case, the fixed circuit waveform estimating unit 3013 calculates the coordinates of the n pieces of points by complementing portions between the plurality of points on the charts. It is assumed here that the voltage drop waveforms have in common the $m^{th}$ section from the origin of the time axis, and each point located at the boundary between sections, where "m" is an integer ranging from "1" to "9" inclusive. The fixed circuit waveform estimating unit 3013 estimates points on the voltage drop waveform of the fixed circuit unit 3003 which correspond to three points located at boundaries, based on the three points.

FIG. 5 shows positional relationships among the points on the voltage drop waveforms 1021, 1022 and 1023, in which points at both ends of the second section are taken as an example. Each reference number that is included in both FIGS. 4 and 5 indicates a same point or line. In FIGS. 4 and 5 showing graphs, the horizontal axis represents time t, and vertical axis represents voltage drop value ΔV.

First, points that correspond to the three points 1031, 1028, and 1026 at the boundaries of the first section are estimated. In the following, t coordinate and ΔV coordinate of a point to be estimated are denoted as (X, Y) for the sake of convenience. Also, a t coordinate of a point 1028 in the voltage drop waveform 1022 for an operation as designed is denoted as tm1. Further, tm/tp represents performance data which has been described above.

The fixed circuit waveform estimating unit 3013 obtains a value of "X" by performing a calculation represented by the following equation.

$$X = tm1 \times (tm/tp)$$ (Equation 1)

Next, when a condition tm/tp≦1 is satisfied, the fixed circuit waveform estimating unit 3013 obtains a point 1038 whose t coordinate value is X obtained on a line connecting a point 1028 and a point 1031, and then obtains Y of the ΔV coordinate from the t coordinate of the point 1038.

When a condition tm/tp>1 is satisfied, the fixed circuit waveform estimating unit 3013 obtains a point 1042 whose t coordinate value is X obtained on a line connecting a point 1028 and a point 1026, and then obtains Y of the ΔV coordinate from the t coordinate of the point 1042.

In this way, coordinates (X, Y) of the point 1038 or the point 1042 are calculated.

Next, the fixed circuit waveform estimating unit 3013 performs similar calculations with respect to the three points 1032, 1029 and 1027 at the boundaries between the second and third sections to obtain coordinates (X, Y) of the point 1039 when a condition tm/tp≦1 is satisfied, and coordinates (X, Y) of the point 1043 when a condition tm/tp>1 is satisfied.

The fixed circuit waveform estimating unit 3013 obtains values of nine points by performing similar calculations with respect to each boundary, and estimates the voltage drop waveform of the fixed circuit unit 3003 based on the obtained values of points. Note that the voltage drop waveform obtained here is called estimated waveform of the fixed circuit unit 3003.

When a condition tm/tp (performance data)≦1 is satisfied, an estimated waveform 2001a shown in FIG. 5 is obtained as a result of estimation; and when a condition tm/tp (performance data)>1 is satisfied, an estimated waveform 2001b shown in FIG. 5 is obtained as a result of estimation.

This completes an explanation of the method of estimating the voltage drop waveform. However, this is merely one example of the method, and there are other applicable methods.

(5) Reconfigurable Circuit Waveform Storage Unit 1012

The reconfigurable circuit waveform storage unit 1012 is composed of a nonvolatile storage medium.

The reconfigurable circuit waveform storage unit 1012 stores a plurality of pieces of configuration information and a plurality of voltage drop waveforms for each piece of configuration information, are estimated to be observed in a circuit built in the reconfigurable circuit unit 3004. These are obtained through simulations.

Figure 6:
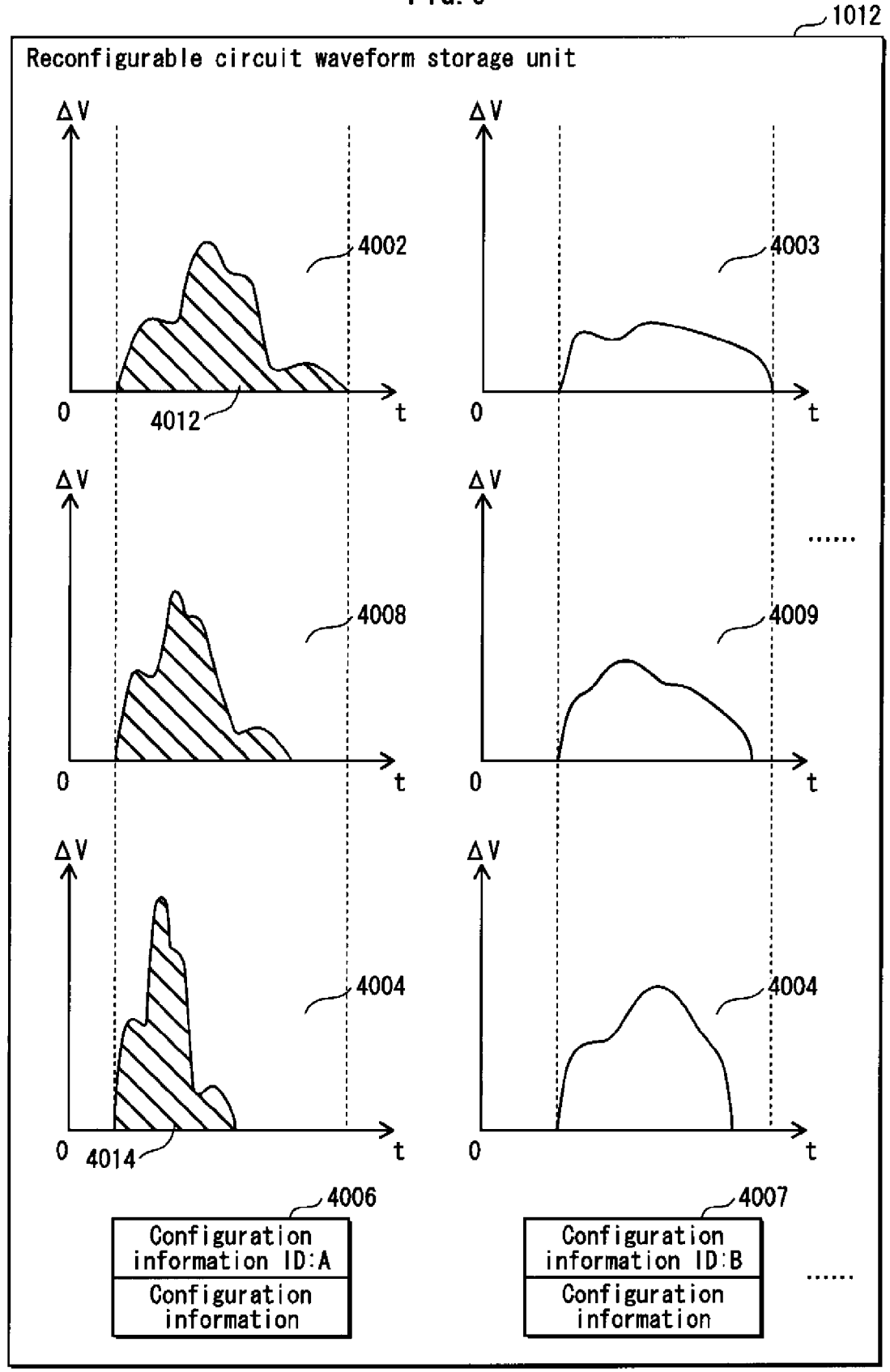
FIG. 6 shows one example of data stored in the reconfigurable circuit waveform storage unit 1012.

FIG. 6 shows one example of data stored in the reconfigurable circuit waveform storage unit 1012. As shown in FIG. 6, the reconfigurable circuit waveform storage unit 1012 stores a plurality of pieces of configuration information 4006, 4007, . . . The circuits built in the reconfigurable circuit unit 3004 have different configurations, but have the same function. For example, in the case where the result is always the same no matter how the calculation order is changed, they would be a plurality of pieces of configuration information that are different from each other in calculation order. Also, in the case where a desired function can be achieved, they may be a plurality of pieces of configuration information that can build circuits conforming to different algorithms in the reconfigurable circuit unit, as well as with different calculation orders. The circuits indicated by the configuration information may be candidates for a circuit to be built in the reconfigurable circuit unit 3004.

Note that, when the operation time exceeds a predetermined value (in this example, a time period corresponding to one cycle of clock), a delay error occurs, and thus such circuits are not selected as the candidates.

The plurality of pieces of configuration information include configuration information ID "A", "B", ... which identify themselves uniquely. In the following, for the sake of convenience, configuration information including configuration information ID "A" is referred to as configuration information A, and a configuration of a circuit built by the configuration information A is referred to as configuration A.

Further, the reconfigurable circuit waveform storage unit 1012 stores three types of voltage drop waveforms for each piece of configuration information. These voltage drop waveforms are generated through simulations and indicate voltage drop waveforms that respectively indicate changes in the voltage drop values that occur when a circuit built in the reconfigurable circuit unit 3004 according to the corresponding piece of configuration information operates.

The relationships among the three types of voltage drop waveforms are similar to the relationships among the three voltage drop waveforms shown in FIG. 4. One of the voltage drop waveforms is a waveform obtained by performing a simulation using parameters set to the manufacturing conditions and operational conditions as designed, and the operation time matches the design target value. Another of the voltage drop waveforms is a waveform obtained by performing a simulation using parameters set so that the operation time is longer than the design target value. And the remaining one is a waveform obtained by performing a simulation using parameters set so that the operation time is shorter than the design target value.

The voltage drop waveforms 4002, 4008 and 4004 correspond to a circuit having the configuration A, for example. The voltage drop waveform 4002 is a voltage drop waveform that indicates a variation in the voltage drop value of the circuit having the configuration A when the operation time is longer than the design target value. The voltage drop waveform 4008 is a voltage drop waveform that indicates a variation in the voltage drop value of the circuit having the configuration A when it operates with the operation time as designed. The voltage drop waveform 4004 is a voltage drop waveform that indicates a variation in the voltage drop value of the circuit having the configuration A when the operation time is shorter than the design target value.

These three types of voltage drop waveforms maybe obtained by performing simulations setting different parameters indicating the manufacturing conditions and operational conditions. Alternatively, as described above in "(3) Fixed circuit waveform storage unit 1011", only one of the three voltage drop waveform may be obtained through a simulation, and the other two voltage drop waveforms may be estimated by performing approximate calculations.

These voltage drop waveforms are generated by a simulation unit (not illustrated) and are recorded into the reconfigurable circuit waveform storage unit 1012.

(6) Reconfigurable Circuit Waveform Estimating Unit 3017

The reconfigurable circuit waveform estimating unit 3017 reads out three types of voltage drop waveforms corresponding respectively to each piece of configuration information, and based on the voltage drop waveforms and the performance data tm/tp, generates an estimated waveform that indicates variations in the voltage drop value of the circuit built according to each piece of configuration information.

Concrete procedures of the estimation are the same as those performed in the fixed circuit unit 3003, and description thereof is omitted here.

The reconfigurable circuit waveform estimating unit 3017 outputs the estimated waveforms generated for each piece of configuration information, one by one to the combined waveform generating unit 3018.

(7) Combined Waveform Generating Unit 3018

The combined waveform generating unit 3018 is provided with an internal memory (not illustrated), receives an estimated waveform of the fixed circuit unit 3003 from the fixed circuit waveform estimating unit 3013, receives a plurality of estimated waveforms of the reconfigurable circuit unit 3004, and temporarily stores the received estimation waveforms into the internal memory.

Next, the combined waveform generating unit 3018 generates a combined waveform by combining the estimated waveform of the fixed circuit unit 3003 stored in the internal memory, with the estimated waveforms of the reconfigurable circuit unit 3004 corresponding to each configuration. The combined waveform generated here is a voltage drop waveform of the whole integrated circuit 3000 that is estimated when the fixed circuit unit 3003 and the reconfigurable circuit unit 3004 operate simultaneously.

Figure 7:
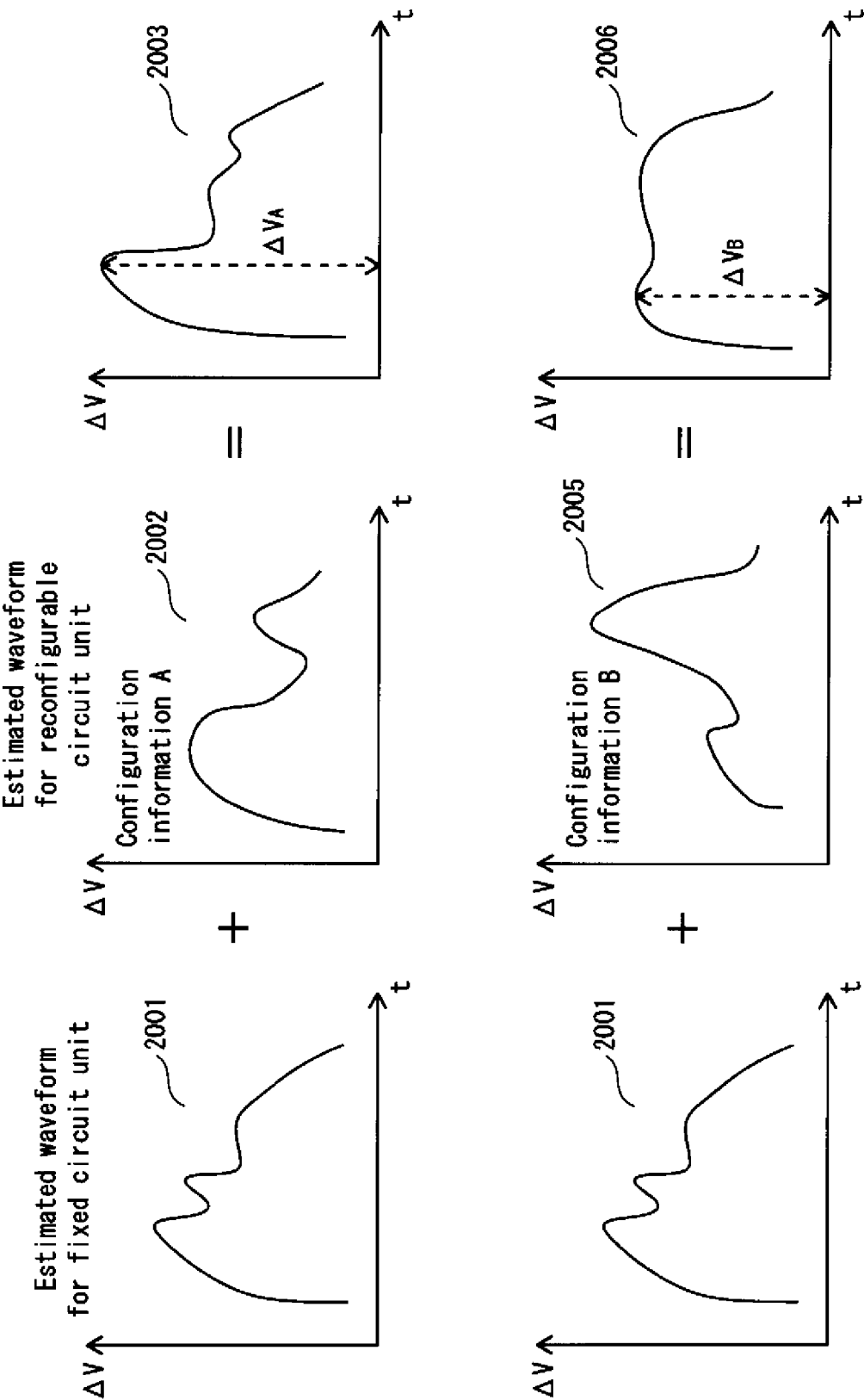
FIG. 7 shows one example of the process performed by the combined waveform generating unit 3018 and maximum voltage drop values ($\Delta VA$, $\Delta VB$, ...) detected by the maximum voltage drop value detecting unit 3019.

More specifically, as shown in FIG. 7, the combined waveform generating unit 3018 generates a combined waveform 2003 by combining an estimated waveform 2001 of the fixed circuit unit 3003 with an estimated waveform 2002 that is estimated when a circuit with the configuration A is built in the reconfigurable circuit unit 3004. The combined waveform generating unit 3018 then outputs the generated combined waveform 2003 to the maximum voltage drop value detecting unit 3019.

Following this, the combined waveform generating unit 3018 performs same processes for each of the configuration B, ...

Note that each voltage drop waveform may not be a function representing a curve as shown in the drawing figures, but may be coordinates of a plurality of points on a curve. In this case, there may be a case where the t coordinate of each point on the estimated waveform of the fixed circuit does not match the t coordinate of each point on the estimated waveform of the reconfigurable circuit. When this happens, first, portions between adjacent two points are complemented in one of the two voltage drop waveforms, then a voltage drop value of the same point of the t coordinate on the voltage drop waveform as a point of the t coordinate on the other voltage drop waveform is calculated, and the calculated value is added.

(8) Maximum Voltage Drop Value Detecting Unit 3019

The maximum voltage drop value detecting unit 3019 receives one by one from the combined waveform generating unit 3018, combined waveforms 2003, 2006, ... of the whole integrated circuit 3000 for the case where configuration information A, B, ... are built in the reconfigurable circuit unit 3004.

Upon receiving them, the maximum voltage drop value detecting unit 3019 detects a maximum voltage drop value from the received combined waveforms.

As shown in FIG. 7, for example, the maximum voltage drop value detecting unit 3019 detects a maximum voltage drop value $\Delta VA$ from the combined waveform 2003 calculated in correspondence with the configuration A. Following this, the maximum voltage drop value detecting unit 3019 outputs the detected maximum voltage drop value $\Delta VA$ to the comparing unit 3021.

Similarly, the maximum voltage drop value detecting unit 3019 detects a maximum voltage drop value $\Delta VB$, ... with respect to other combined waveform 2006, ..., and outputs the detected maximum voltage drop values to the comparing unit 3021.

(9) Comparing Unit 3021

The comparing unit 3021 is provided with an internal memory, and the internal memory stores a threshold value $\Delta Vth$ of the voltage drop value which is set in the design phase. The threshold value $\Delta Vth$ is the maximum value of the voltage drop value within a range in which a correct operation is ensured as far as there is no error such as a disconnection or a short circuit in the integrated circuit 3000.

The comparing unit 3021 receives the maximum voltage drop values $\Delta VA$, $\Delta VB$, . . . one by one from the maximum voltage drop value detecting unit 3019. Upon receiving them, the comparing unit 3021 compares the threshold value $\Delta Vth$ with each of the received maximum voltage drop values $\Delta VA$, $\Delta VB$, . . . , and outputs the comparison results to the judging unit 3023.

(10) Judging Unit 3023

The judging unit 3023 receives, from the comparing unit 3021, the comparison results between the threshold value $\Delta Vth$ and each of the received maximum voltage drop values $\Delta VA$, $\Delta VB$, . . . corresponding to each configuration. When the received comparison results satisfy $\Delta Vn \geq \Delta Vth$ (n=A, B, . . . ), the judging unit 3023 deletes $\Delta Vn$. When the received comparison results satisfy $\Delta Vn < \Delta Vth$, the judging unit 3023 reads out configuration information whose configuration information ID is "n" from the reconfigurable circuit waveform storage unit 1012, and outputs the read-out configuration information to the integrated circuit 3000. Note that, when a plurality of $\Delta Vn$ satisfying $\Delta Vn < \Delta Vth$ are detected, the judging unit 3023 outputs a piece of configuration information that corresponds to $\Delta Vn$ having the smallest value among the plurality of $\Delta Vn$.

Also, when no $\Delta Vn$ satisfying $\Delta Vn < \Delta Vth$ is detected, the judging unit 3023 displays, on the monitor, a message that an integrated circuit that is currently targeted for manufacturing is a defect, and notifies the operator that a defect is found.

1.4 Operation

Figure 8:
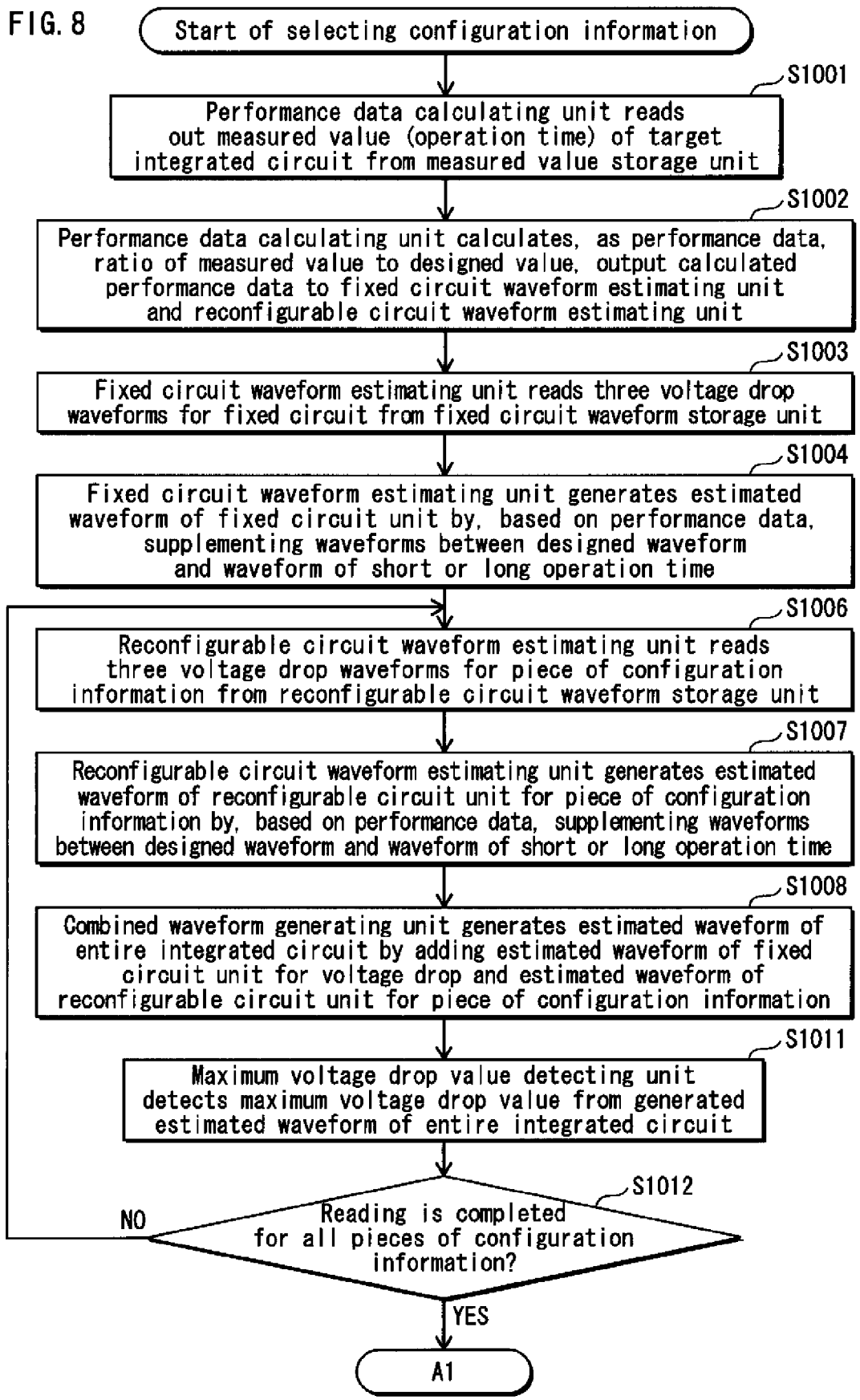
FIG. 8 is a flowchart showing operation in the process of selecting configuration information performed by the configuration determining server 3007.
Figure 9:
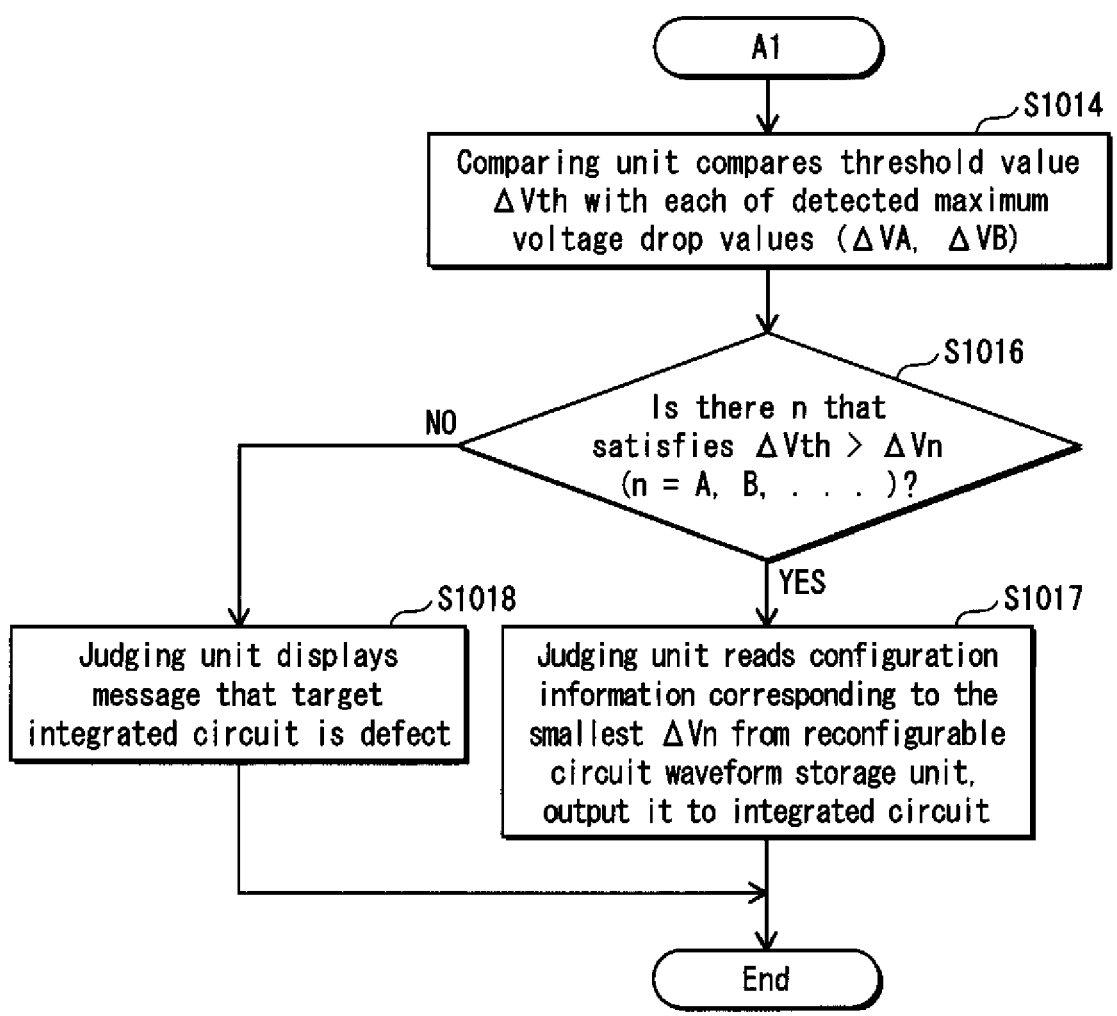
FIG. 9 is a flowchart showing operation in the process of selecting configuration information performed by the configuration determining server 3007, continued from FIG. 8.

The following describes the operation in the process of selecting configuration information performed by the configuration determining server 3007, with reference to the flowcharts shown in FIGS. 8 and 9. The description is under the presumption that the above-described data have already been stored in the measured value storage unit 1010, the fixed circuit waveform storage unit 1011, and the reconfigurable circuit waveform storage unit 1012.

First, the performance data calculating unit 3011 reads out the measured value of the integrated circuit 3000 being the manufacturing target (operation time tm of the ring oscillator) from measured value storage unit 1010 (step S1001).

Next, the performance data calculating unit 3011 calculates, as performance data, a ratio tm/tp that is a ratio of the measured value (tm) to the design target value (tp), and outputs the calculated performance data to the fixed circuit waveform estimating unit 3013 and the reconfigurable circuit waveform estimating unit 3017 (step S1002).

The fixed circuit waveform estimating unit 3013 reads out three voltage drop waveforms 1021, 1022 and 1023 for the fixed circuit unit 3003 from the fixed circuit waveform storage unit 1011 (step S1003). The fixed circuit waveform estimating unit 3013 then generates an estimated waveform of the fixed circuit unit 3003 by, based on the performance data tm/tp, complementing between the designed waveform and the waveform of short operation time, or between the designed waveform and the waveform of long operation time (step S1004). The fixed circuit waveform estimating unit 3013 outputs the generated estimation waveform to the combined waveform generating unit 3018.

The reconfigurable circuit waveform estimating unit 3017 reads out three voltage drop waveforms corresponding to one piece of configuration information from the reconfigurable circuit waveform storage unit 1012 (step S1006).

The reconfigurable circuit waveform estimating unit 3017 then generates an estimated waveform of a circuit that is built in the reconfigurable circuit unit 3004 according to the one piece of configuration information by, based on the performance data tm/tp, complementing between the designed waveform and the waveform of short operation time, or between the designed waveform and the waveform of long operation time (step S1007). The reconfigurable circuit waveform estimating unit 3017 outputs the generated estimation waveform to the combined waveform generating unit 3018.

The combined waveform generating unit 3018 generates an estimated waveform of the whole integrated circuit 3000 by adding the received estimation waveform of the fixed circuit unit 3003 and the estimated waveform of the reconfigurable circuit unit 3004 (step S1008).

The maximum voltage drop value detecting unit 3019 detects a maximum voltage drop value from the generated estimation waveform (step S1009).

Here, when the reading of the voltage drop waveforms by the reconfigurable circuit waveform estimating unit 3017 is completed for all pieces of configuration information (YES in step S1012), the configuration determining server 3007 goes to step 51014.

When the reading of the voltage drop waveforms by the reconfigurable circuit waveform estimating unit 3017 is not completed for all pieces of configuration information (NO in step S1012), the control returns to step S1006, and the process of steps S1006 through S1011 is repeated for all pieces of configuration information.

The comparing unit 3021 receives maximum voltage drop values ($\Delta VA$, $\Delta VB$, . . . ), and compares the threshold value $\Delta Vth$ with each of the maximum voltage drop values (step S1014), and outputs the comparison results to the judging unit 3023.

When, based on the received comparison results, the judging unit 3023 judges that there is no "n" satisfying $\Delta Vn < \Delta Vth$ (n=A, B, . . . ) (NO in step S1016), the judging unit 3023 displays, on the monitor, a message that an integrated circuit that is currently targeted for manufacturing is a defect (step S1018).

When, based on the received comparison results, the judging unit 3023 judges that there is "n" satisfying $\Delta Vn < \Delta Vth$ (YES in step S1016), the judging unit 3023 reads out configuration information corresponding to $\Delta Vn$ from the reconfigurable circuit waveform storage unit 1012, and outputs the read-out configuration information to the integrated circuit 3000 (step S1017).

Note that, when a plurality of $\Delta Vn$ satisfying $\Delta Vn < \Delta Vth$ are detected, the judging unit 3023 outputs a piece of configuration information that corresponds to $\Delta Vn$ having the smallest value among the plurality of $\Delta Vn$.

1.5 Summary/Effects

With the above-described structure for determining the configuration information, the configuration determining server can select a piece of configuration information that can make the maximum voltage drop value as small as possible. This also makes small the electric current density for operation as designed. This makes it possible to reduce the width of wiring. That is to say, it is possible to reduce the margin with regard to the width of wiring.

In addition, it is possible to operate the semiconductor integrated circuit without causing a deterioration in reliability. Also, it is possible to reduce the amount of generated noise.

2. Embodiment 2

The following describes a manufacturing system as another embodiment of the present invention.

2.1 Outline

In Embodiment 2, an integrated circuit 6000 measures the voltage drop waveform of the fixed circuit unit 3003.

A configuration determining server 7007 calculates performance data based on the voltage drop waveform, and with a similar procedure to that of Embodiment 1, estimates voltage drop waveforms respectively for candidate configurations for being built in the reconfigurable circuit unit 3004.

On the other hand, the configuration determining server 7007 obtains the measured voltage drop waveform regarding the fixed circuit unit 3003, and generates a combined waveform indicating a change in the voltage drop value of the whole integrated circuit, by adding the measured voltage drop waveform and the estimated waveform of the reconfigurable circuit unit.

2.2 Integrated Circuit 6000

Figure 10:
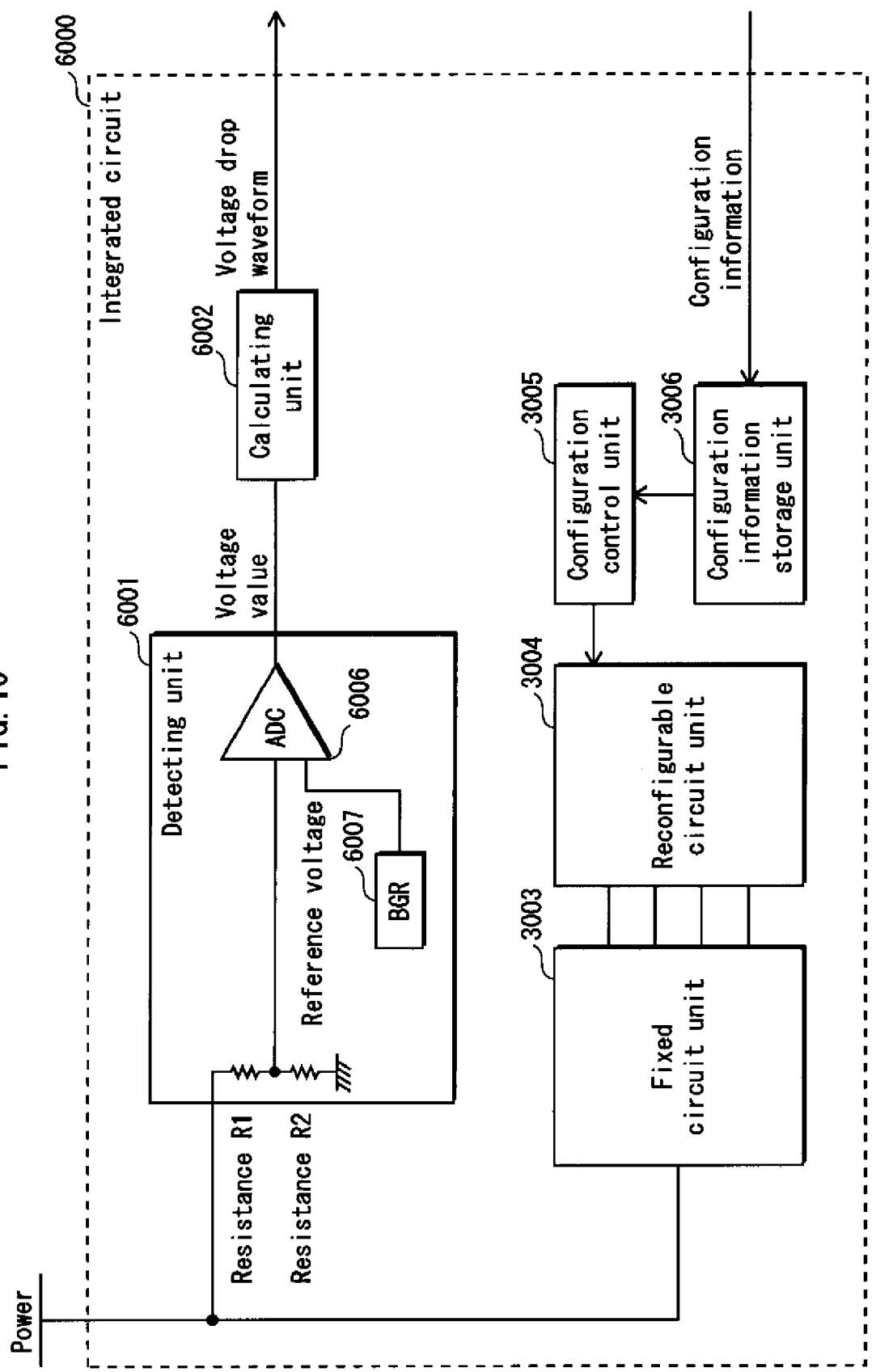
FIG. 10 is a block diagram showing the structure of the integrated circuit 6000 in Embodiment 2.

The integrated circuit 6000, as shown in FIG. 10, includes a detecting unit 6001, a calculating unit 6002, a fixed circuit unit 3003, a reconfigurable circuit unit 3004, a configuration control unit 3005, and a configuration information storage unit 3006.

The detecting unit 6001 and the fixed circuit unit 3003 of the integrated circuit 6000 are connected with the power source, and the fixed circuit unit 3003 actually operates.

The components of the present embodiment are the same as those of Embodiment 1 except for the detecting unit 6001 and the calculating unit 6002. The components which are common to both embodiments are assigned the same reference numbers, and description thereof is omitted here.

(1) Detecting Unit 6001

The detecting unit 6001, as shown in FIG. 10, includes two resistances, an AD converter 6006 and a BGR (BandGap Reference) 6007.

The AD converter 6006, as shown in FIG. 10, is connected with the power source and the fixed circuit unit 3003, and calculates a voltage value based on an input signal received through a signal line connecting with these.

The AD converter 6006 receives the input signal through the signal line, and receives a reference voltage generated by the BGR 6007. The AD converter 6006 calculates voltage value from the reference voltage and a voltage of the signal line, and outputs the calculated voltage value to the calculating unit 6002 at prescribed intervals or continuously.

(2) Calculating Unit 6002

The calculating unit 6002 receives the voltage value from the detecting unit 6001. Upon receiving the voltage value, the calculating unit 6002 corrects the voltage value by taking the resistances R1 and R2 into consideration, and calculates a voltage drop value by subtracting the voltage value after amendment from a predetermined voltage (for example, a power source voltage or a designed reference voltage).

The calculating unit 6002 repeats the above-described calculation, generates voltage drop waveforms from the calculated voltage drop values, and outputs the generated voltage drop waveforms at prescribed intervals.

2.3 Configuration Determining Server 7007

Figure 11:
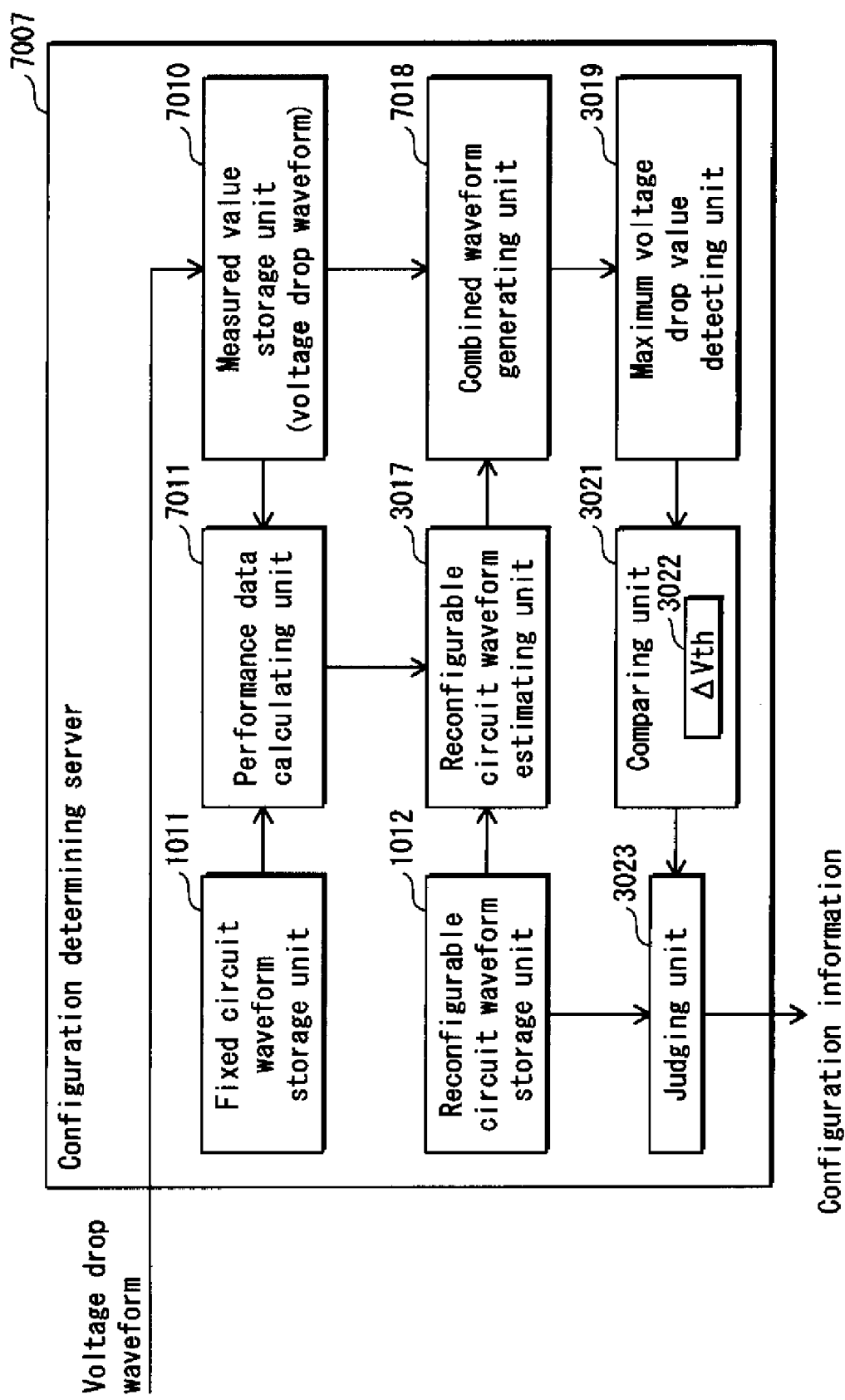
FIG. 11 is a block diagram showing the structure of the configuration determining server 7007 in Embodiment 2.

The configuration determining server 7007, as shown in FIG. 11, includes a performance data calculating unit 7011, a measured value storage unit 7010, a reconfigurable circuit waveform storage unit 1012, a reconfigurable circuit waveform estimating unit 3017, a combined waveform generating unit 7018, a maximum voltage drop value detecting unit 3019, a comparing unit 3021, and a judging unit 3023.

The reconfigurable circuit waveform storage unit 1012, the reconfigurable circuit waveform estimating unit 3017, the maximum voltage drop value detecting unit 3019, the comparing unit 3021, and the judging unit 3023 are the same as those in Embodiment 1, and description thereof is omitted here.

(1) Measured Value Storage Unit 7010

The measured value storage unit 7010 stores the voltage drop waveform of the fixed circuit unit 3003 output from the integrated circuit 6000. Note that the measured value storage unit 7010 may obtain a plurality of voltage drop values (measured values) at prescribed intervals, generate a voltage drop waveform by complementing between the obtained voltage drop values, and store the generated voltage drop waveform.

(2) Performance Data Calculating Unit 7011

The performance data calculating unit 7011 is a functional unit that calculates performance data for the measured voltage drop waveform of the fixed circuit unit 3003.

Here, a concept is introduced to calculate the performance data in the present embodiment. The concept is characteristic amount of voltage drop waveform.

Figure 12A:
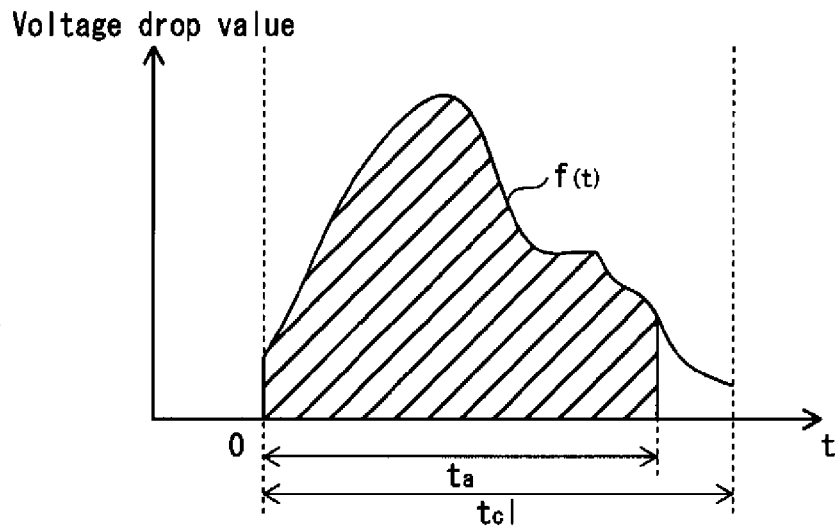
FIG. 12A shows a concept of how to calculate the characteristic amount.

FIG. 12A shows a concept of how to calculate the characteristic amount. It is assumed that the operation time of the integrated circuit in one cycle is one clock cycle, and the voltage drop waveform is considered as a function f(t) of time t. A sign "ta" represents a time (called "characteristic time") which corresponds to 90% (the shaded part in FIG. 12A) of an integration value of f(t) during one clock cycle (tcl).

That is to say, the characteristic time ta satisfies the following Equation 2.

[Formula 1]

$$\frac{\int_0^{ta} f(t)dt}{\int_0^{tcl} f(t)dt} = 0.9 \quad \text{(Equation 2)}$$

In the above equation, a ratio of characteristic time ta to one clock cycle tcl is represented as follows.

Characteristic amount $X=ta/tcl$

In the present embodiment, a ratio X1/X2 is used as the performance data, where X1 represents a characteristic amount of the measured voltage drop waveform f1(t), and X2 represents a characteristic amount of voltage drop waveform f2(t) which is obtained by performing a simulation for an operation as designed.

It should be noted here that, in the present embodiment, the characteristic time ta is defined by Equation 2 for the following reasons.

The voltage drop occurs continuously during a period of one clock cycle, but in many cases, the voltage drop value becomes very small near the end of the period. The time period which the voltage drop value goes down depends on the characteristics of the circuit. In view of this, in the present embodiment, it is assumed that the voltage drop value is very small after passing of the time period which corresponds to 90% of an integration value of the voltage drop value, and the characteristic amount is calculated by using the time period corresponding to 90% of the integration value.

Accordingly, the value does not necessary be 90%, but may be determined arbitrarily based on the voltage drop waveform of the target integrated circuit.

Now, a detailed description is given of the performance data calculating unit 7011.

Figure 12B:
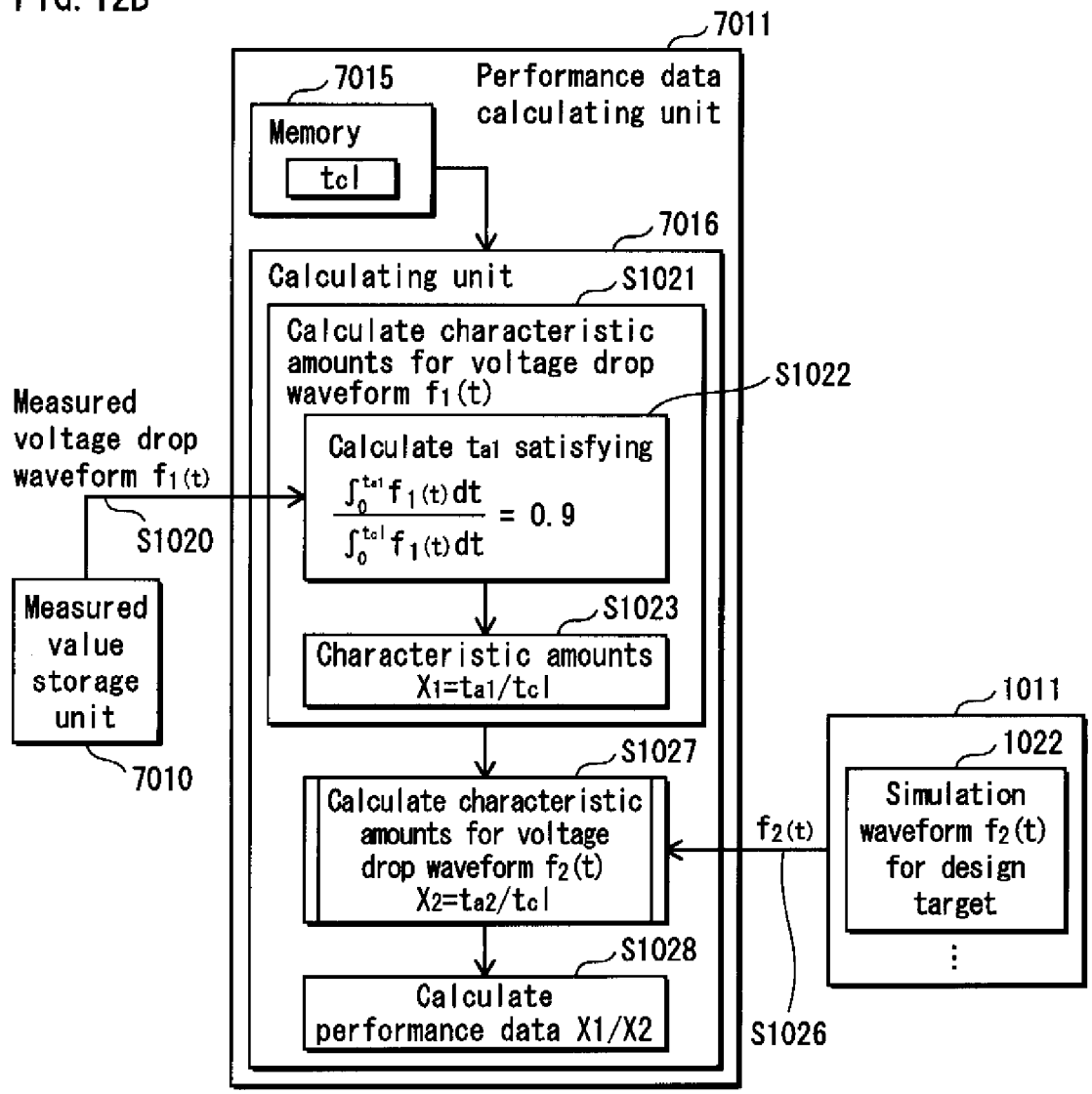
FIG. 12B shows the structure and function of the performance data calculating unit 7011.

As shown in FIG. 12B, the performance data calculating unit 7011 includes a memory 7015 and a calculating unit 7016. The memory 7015 stores one clock cycle time "tcl".

First, the calculating unit 7016 of the performance data calculating unit 7011 obtains the measured voltage drop waveform f1(t) from the measured value storage unit 7010 (step S1020). The calculating unit 7016 calculates a characteristic amount for the voltage drop waveform f1(t) by performing steps 51022 through S1023 (step S1021).

The calculating unit 7016 first calculates characteristic time ta1 satisfying the above-shown Equation 2 with respect to the voltage drop waveform f1(t) (step S1022). The calculating unit 7016 then calculates a ratio (ta1/tcl) of the calculated ta1 to tcl, as the characteristic amount X1 (=ta1/tcl) of the f1(t) (step S1023).

Next, the calculating unit 7016 reads out a simulation waveform f2(t) of voltage drop waveform for operation as designed, from the fixed circuit waveform storage unit 1011 (step 81026). The simulation waveform f2(t) read out here is the voltage drop waveform 1022 shown in FIG. 4.

The calculating unit 7016 calculates the characteristic amount X2 (=ta2/tcl) of the voltage drop waveform f2(t) with the same procedure as in step S1021 (step S1027).

The calculating unit 7016 calculates the performance data X1/X2 from the calculated characteristic amounts X1 and X2.

The performance data calculating unit 7011 outputs the performance data (X1/X2) calculated in this way to the reconfigurable circuit waveform estimating unit 3017.

(3) Combined Waveform Generating Unit 7018

The combined waveform generating unit 7018 is almost the same as the combined waveform generating unit 3018 in Embodiment 1, except that the combined waveform generating unit 7018 uses a measured voltage drop waveform stored in the measured value storage unit 7010 in place of the estimated waveform 2001 estimated by the fixed circuit waveform estimating unit 3013.

2.4 Effects

Embodiment 2, compared with Embodiment 1, eliminates the need for the fixed circuit unit to estimate the waveform. In addition, Embodiment 2 makes it possible to generate a combined waveform based on the waveform of an actual device. Such a structure thus makes it possible to reduce the uncertainty in estimation and generate a combined waveform with high accuracy. This enables the maximum voltage drop value to be estimated more accurately, resulting in selection of configuration information with a smaller maximum voltage drop value.

2.5 Modifications

The following describes modifications of Embodiment 2.

(1) Obtaining Performance Data by Ring Oscillator

Figure 13:
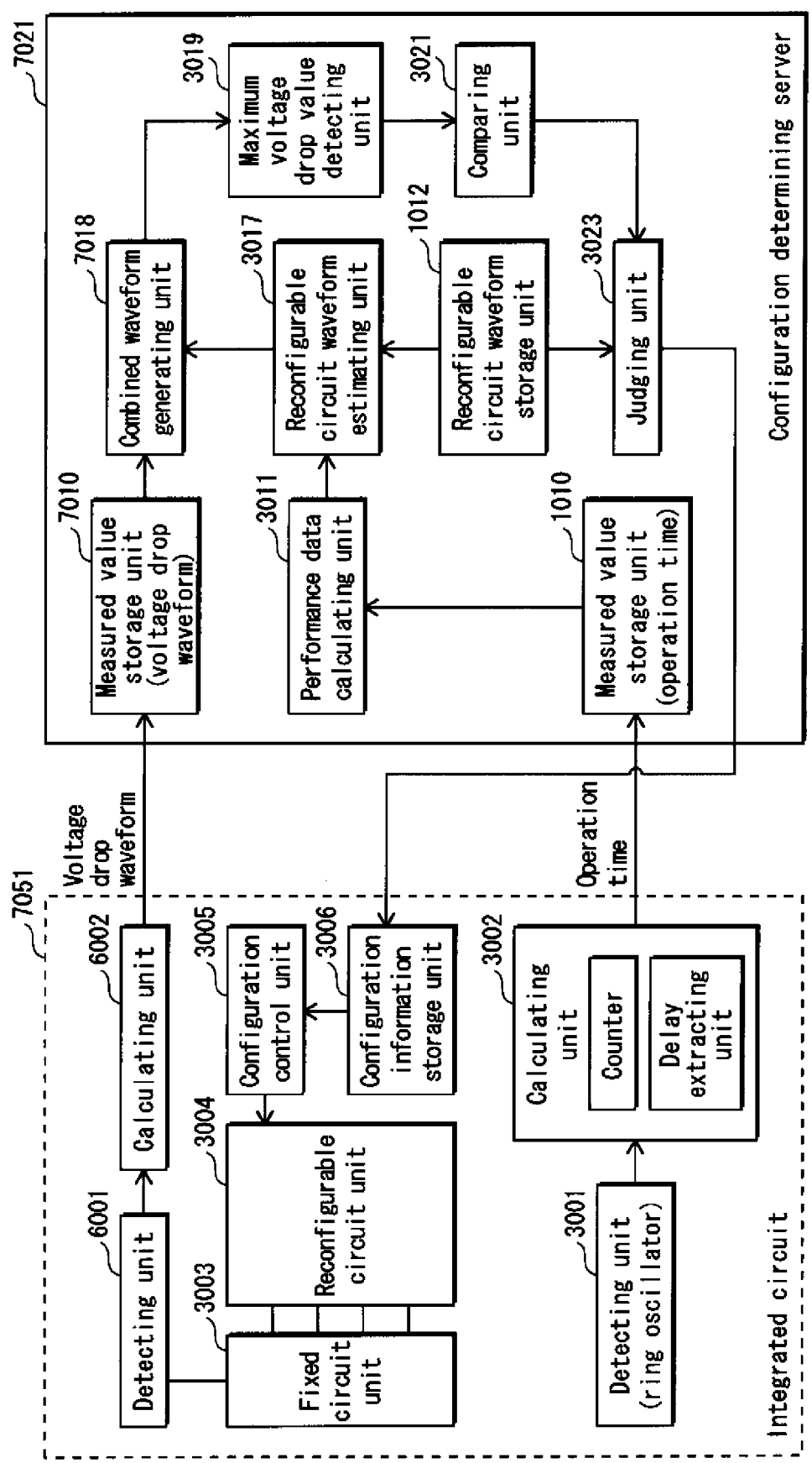
FIG. 13 is a block diagram showing the structure and data flow of the integrated circuit 7051 and the configuration determining server 7021 in Modification (1) of Embodiment 2.

FIG. 13 is a block diagram showing a modification. An integrated circuit 7051 has a structure including the elements of the integrated circuit of Embodiment 2, as well as the detecting unit 3001 and the calculating unit 3002 described in Embodiment 1.

The calculating unit 6002 outputs the voltage drop waveform, and the calculating unit 3002 outputs the operation time of the ring oscillator.

A configuration determining server 7021 includes a measured value storage unit 7010 storing the voltage drop waveform, as well as a measured value storage unit 1010 storing the operation time of the ring oscillator. Also, the configuration determining server 7021 includes the performance data calculating unit 3011 described in Embodiment 1, in place of the performance data calculating unit 7011.

With this structure, the performance data calculating unit 3011 can calculate the performance data by performing a simple calculation which calculates a ratio. This eliminates the need to perform an integration calculation as in Embodiment 2, reducing the processing load of the configuration determining server 7021.

Also, in this modification, measured voltage drop waveforms are obtained. This makes it possible to estimate the maximum voltage drop value more accurately as in Embodiment 2.

(2) Voltage Waveform Instead of Voltage Drop Waveform

In Embodiment 2, the configuration determining server obtains the voltage drop waveform from the integrated circuit and stores it in the measured value storage unit. However, instead of this, a voltage waveform may be obtained.

Figure 14:
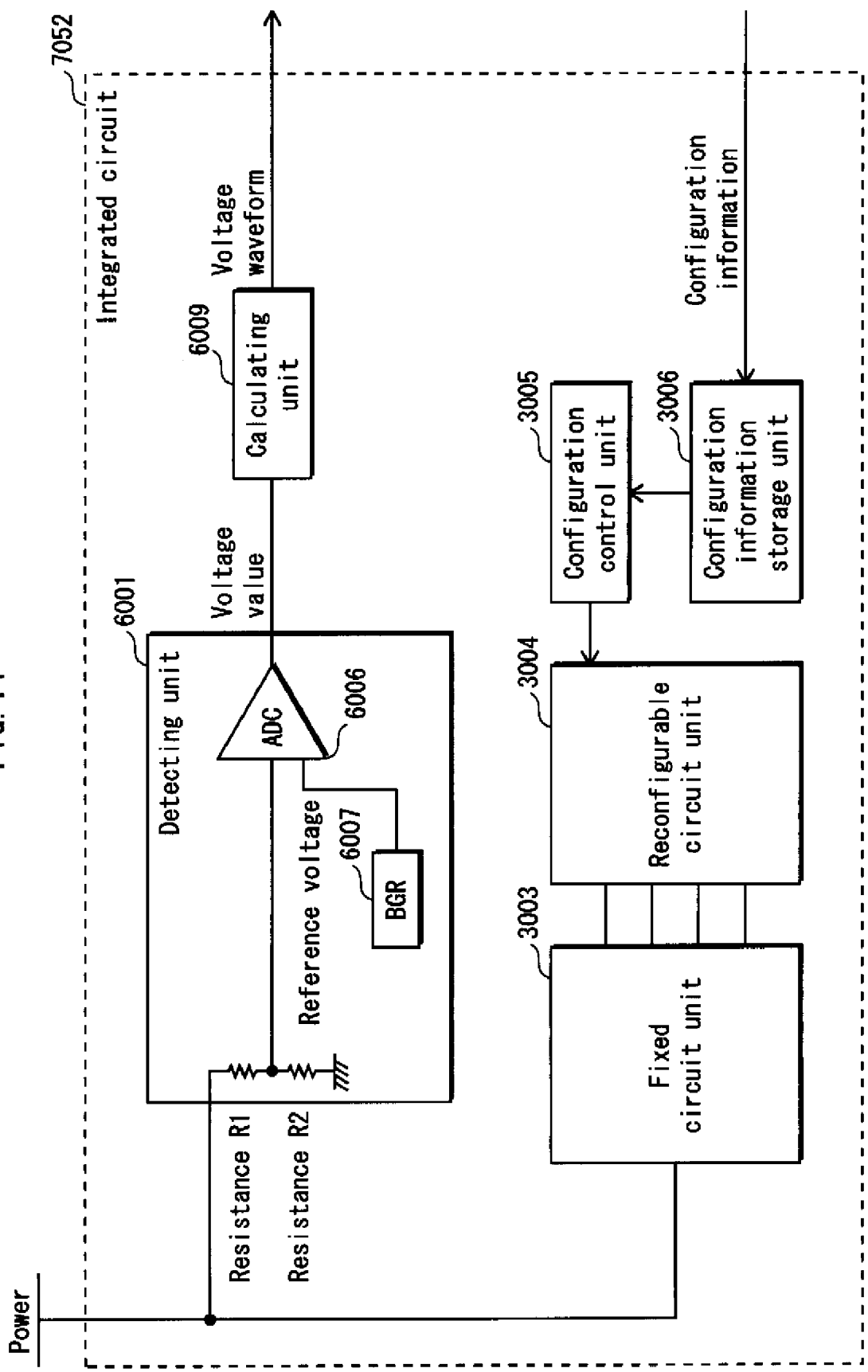
FIG. 14 is a block diagram showing the structure of the integrated circuit 7051 in Modification (2) of Embodiment 2.

FIG. 14 shows the structure of the integrated circuit 7052. The structure is almost the same as the structure shown in FIG. 10 except for a calculating unit 6009.

The calculating unit 6009, each time it receives a voltage value from the detecting unit 6001, corrects the received voltage value by taking the resistances R1 and R2 into consideration, and outputs a plurality of corrected voltage values at prescribed intervals (for example, at every clock cycle), as the voltage waveforms.

A functional block diagram of the configuration determining server is almost the same as that shown in FIG. 11. Accordingly, the following description will be provided with reference to FIG. 11.

The configuration determining server 7007 includes a subtracting unit (not illustrated) at a position between the measured value storage unit 7010 and the input terminal.

A voltage waveform output from the integrated circuit 7052 is first input into the subtracting unit. The subtracting unit generates a voltage drop value waveform by subtracting each voltage value constituting the received voltage waveform from a predetermined voltage (for example, a power source voltage or a voltage applied to circuit determined at the design phase), and writes the generated voltage drop value waveform into the measured value storage unit 7010.

The other components are the same as those in Embodiment 2.

Note that the measured value storage unit 7010 may obtain a plurality of voltage values (measured values) at prescribed time intervals, generate voltage waveforms by complementing between the obtained voltage values, and store the generated voltage waveforms.

3. Embodiment 3

The following describes a communication system as another embodiment of the present invention.

3.1 Outline

Figure 15:
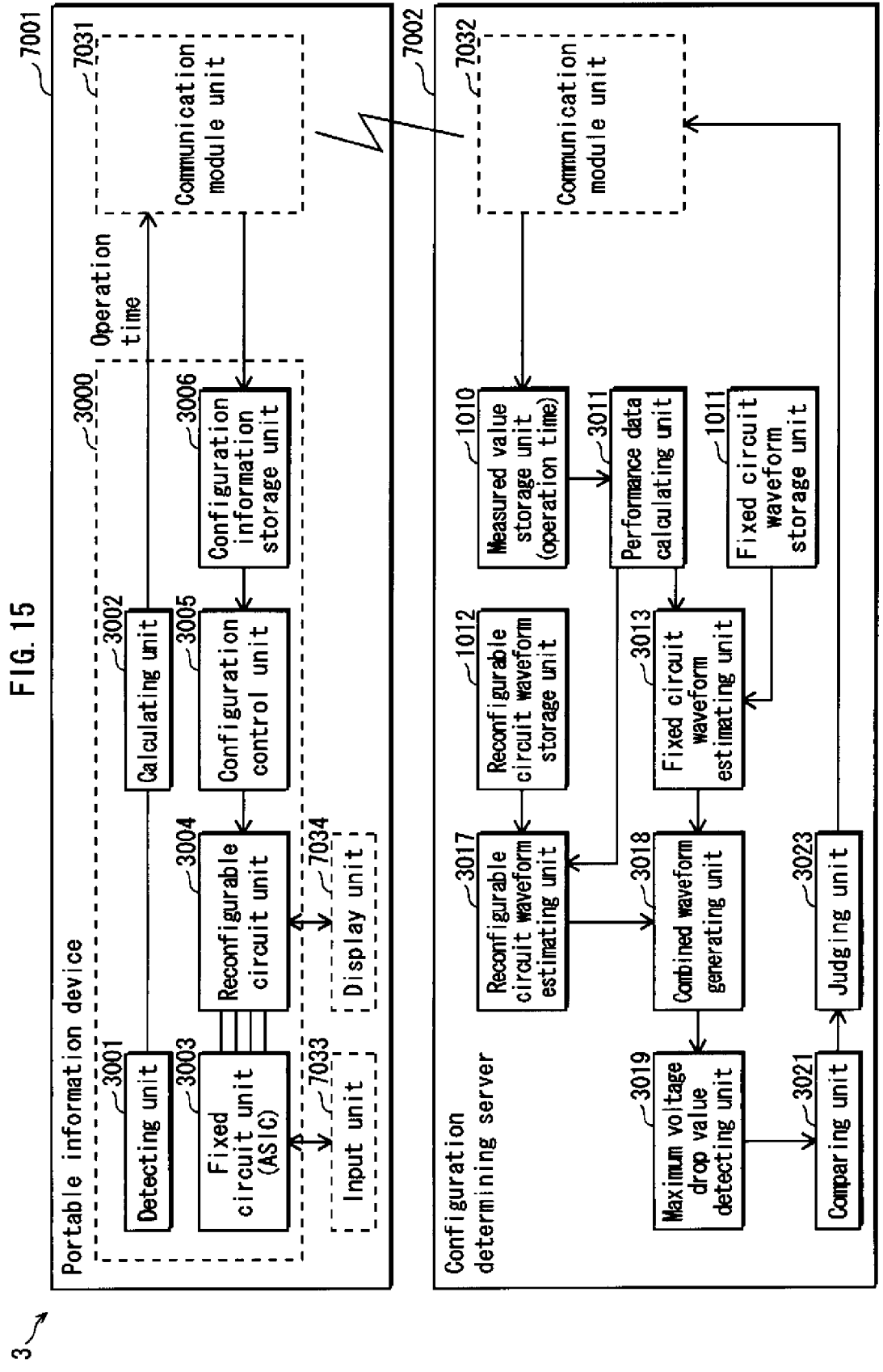
FIG. 15 is a block diagram showing the functional structure of the portable information device 7001 and the configuration determining server 7002 included in the communication system 3 in Embodiment 3.

A communication system 3 of the present embodiment, as shown in FIG. 15, is composed of a portable information device 7001 in which the integrated circuit 3000 described in Embodiment 1 is loaded, and a configuration determining server 7002.

The communication system 3 is a system that, after the system is implemented in the portable information device 7001 and shipped, reconfigures, in the reconfigurable circuit unit 3004, a circuit with an optimum configuration depending on the change of characteristics due to aging degradation of the integrated circuit 3000.

3.2 Structure and Operation

As shown in FIG. 15, the portable information device 7001 includes the integrated circuit 3000 described in Embodiment 1, a communication module unit 7031, a communication module unit 7032, an input unit 7033, and a display unit 7034.

The portable information device 7001 is provided with a timer (not illustrated). When a predetermined time period passes after the shipping (or manufacturing), the timer outputs a control signal indicating that a measuring should be started, to the detecting unit 3001.

Note that the portable information device 7001 may have a structure where a control signal indicating that a measuring should be started is output to the detecting unit 3001 by a predetermined key operation by the user. With this structure, the use of the portable information device 7001 by the user is not interrupted by the measuring start instruction by the timer.

Upon receiving the control signal, the detecting unit 3001 and the calculating unit 3002 measure the data regarding the characteristics of the fixed circuit unit 3003. In this example, they measure the operation time of the ring oscillator as the measured value, as is the case with Embodiment 1.

The calculating unit 3002 transmits the measured operation time to the configuration determining server 7002 via the communication module unit 7031.

The configuration determining server 7002 has the same structure as the configuration determining server 3007 in Embodiment 1 except that it includes the communication module unit 7032. The components which are common to both embodiments are assigned the same reference numbers.

The communication module unit 7032, upon receiving the operation time of the ring oscillator from the portable information device 7001, writes the received operation time into the measured value storage unit 1010.

Each component operates in the same manner as in Embodiment 1 based on the written operation time, and determines configuration information that is optimum for the current state of the fixed circuit 3003.

The judging unit 3023 reads out the determined configuration information from the reconfigurable circuit waveform storage unit 1012 (an arrow indicating the data flow is not illustrated), and transmits the read-out configuration information to the portable information device 7001 via the communication module unit 7032.

The communication module unit 7032, upon receiving the configuration information from the configuration determining server 7002, writes the received configuration information into the configuration information storage unit 3006. The configuration control unit 3005 decodes the configuration information recorded in the configuration information storage unit 3006, and outputs the decoded configuration information to the reconfigurable circuit unit so that the reconfigurable circuit unit 3004 can reconfigure the circuit.

The judging unit 3023 transmits an error notification via the communication module unit 7032 when it judges that there is no appropriate configuration information. The error notification includes, for example, a character sequence indicating "This device includes a partially degraded circuit. Repurchase is recommended". Upon receiving the error notification, the integrated circuit 3000 displays the character sequence included in the error notification onto the display unit 7013.

3.3 Summary/Effects

According to the communication system 3, after the shipping, the integrated circuit conveys, to the configuration determining server, the measured value (operation time) reflecting the characteristics of each product and the change of characteristics due to aging degradation, and the configuration determining server returns configuration that is optimum for the current operation state of the integrated circuit, to the integrated circuit.

With such a structure, even if the characteristics of the fixed circuit unit 3003 change, it is possible to continue a stable operation by adjusting the circuit configuration in the reconfigurable circuit unit 3004.

3.4 Supplemental Notes for Embodiment 3

(1) In Embodiment 3 described above, the configuration information is transmitted from the configuration determining server 7002. However, not limited to this, the portable information device 7001 may have therein a storage mechanism for storing a plurality of pieces of configuration information that are the same as the configuration information stored in the reconfigurable circuit waveform storage unit 1012, and the configuration determining server 7002 may transmit only a configuration information ID identifying the determined configuration information. On the portable information device 7001 side, the storage mechanism writes the configuration information identified by the received configuration information ID into the configuration information storage unit 3006.

With this structure, it is possible to reduce the amount of transmitted/received data greatly.

(2) Also, the portable information device 7001 and the configuration determining server 7002 may be connected with each other by wire.

(3) Furthermore, the portable information device may be provided with the integrated circuit 6000, 7051, or 7052 described in Embodiment 2 or modifications instead of the integrated circuit 3000. In this case, the configuration determining server 7007, 7031 or the like corresponding to the integrated circuit, with the communication module unit loaded therein, is used.

(4) Note that in the embodiment described above, a portable information device is used as one example, but the present invention is not limited to portable information devices.

Many of communication systems, image processing systems, and security processing systems include a plurality of structures in the programmable circuit in order to support a plurality of standards. Therefore, the present invention produces the similar advantageous effect when it is applied to, for example, an image display device such as a TV, DVD player, or car navigation system, an image recording device such as a DVD recorder, video camera, DSC, or security camera, a device such as an audio player, or a communication system or security processing system provided in a communication device.

4. Embodiment 4

The following describes a manufacturing system as another embodiment of the present invention.

Figure 16:
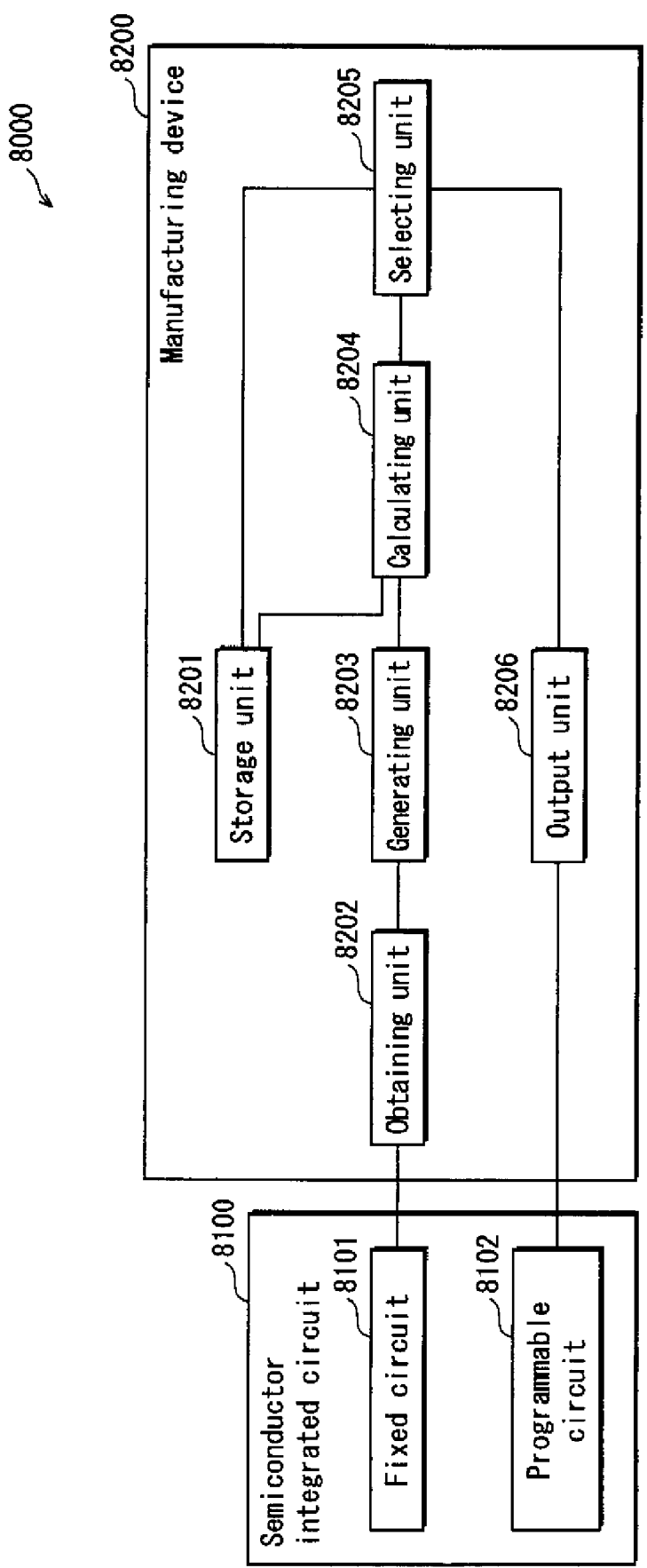
FIG. 16 shows the structure of the manufacturing system 8000 in Embodiment 4.

A manufacturing system 8000, as shown in FIG. 16, is composed of: a semiconductor integrated circuit 8100 being a semifinished product; and a manufacturing device 8200 for outputting appropriate configuration information to the semiconductor integrated circuit 8100, where the semiconductor integrated circuit 8100 is attached to a circuit board (not illustrated).

The semiconductor integrated circuit 8100 includes a programmable circuit 8102 and a fixed circuit 8101.

The manufacturing device 8200 includes a storage unit 8201, an obtaining unit 8202, a generating unit 8203, a calculating unit 8204, a selecting unit 8205, and an output unit 8206.

The storage unit 8201 stores a plurality of pieces of candidate configuration information and a plurality of pieces of first voltage information. The plurality of pieces of candidate configuration information define configurations of a plurality of candidate circuits that are provided in a programmable circuit and that have the same function but different configurations. Also, the plurality of pieces of first voltage information indicate voltage changes that are expected to occur in the programmable circuit when the plurality of candidate circuits operate, respectively.

The obtaining unit 8202 obtains one or more measured values that are measured in the semiconductor integrated circuit 8100, from the semiconductor integrated circuit 8100 in operation.

The generating unit 8203 generates, based on the obtained measured value(s), second voltage information that indicates the voltage change that occurs in the fixed circuit as the fixed circuit operates.

The calculating unit 8204 calculates, for each of the plurality of candidate circuits, a maximum voltage drop amount for the case where both the fixed circuit and the programmable circuit operate, by combining the second voltage information with each of the plurality of pieces of first voltage information.

The selecting unit 8205 selects a combination which corresponds to a maximum voltage drop amount that is smaller than a threshold value, and obtains, from the storage unit 8201, candidate configuration information that determines the configuration of the candidate circuit corresponding to the selected combination.

The output unit 8206 writes the obtained candidate configuration information into the semiconductor integrated circuit.

6. Other Modifications

Up to now, the present invention has been described through several embodiments thereof. However, the present invention is not limited to these embodiments, but may be modified in various ways within the scope of the present invention. The following are examples of such.

(1) In the above-described embodiments, the configuration information is selected based on the performance data that indicates the characteristics of the fixed circuit unit. However, not limited to this, it may be determined based on the characteristics of the whole circuit.

EXAMPLE 1

The integrated circuit is provided with a measuring unit for measuring data that indicates the characteristics of the reconfigurable circuit unit in physical structure. The configuration determining server includes a unit for calculating second performance data from the data measured by the measuring unit, as well as the above-mentioned performance data calculating unit. The reconfigurable circuit waveform estimating unit estimates the voltage drop waveforms by using the second performance data.

EXAMPLE 2

Candidate circuits being candidates for circuits to be built in the reconfigurable circuit unit are built in the reconfigurable circuit unit one by one, and then data (voltage drop waveform, voltage waveform or the like) indicating the characteristics of each candidate circuit is measured while the reconfigurable circuit unit is actually operated.

The combined waveform generating unit calculates, with respect to the fixed circuit unit, the voltage drop waveform of the whole integrated circuit in the case where each candidate circuit is built therein, by adding the estimated or measured voltage drop waveform and the voltage drop waveform being measured or calculated for each candidate circuit.

With this structure, with respect to both the fixed circuit unit and the reconfigurable circuit unit, the voltage drop of the whole integrated circuit is calculated based on the data that was measured while it was actually operated. This enables the configuration determining server to select configuration information that corresponds to the optimum candidate circuit.

(2) In the above-described embodiments, the detecting unit and the calculating unit exist in the integrated circuit. However, the calculating unit may be provided in the configuration determining server. Also, conversely, the performance data calculating unit may be formed in integrated circuit, instead of in the configuration determining server.

(3) Generation of measured values by the detecting unit and the calculating unit in the integrated circuit and writing of the measured values into the measured value storage unit may be performed prior to or immediately before the selection of the configuration information by the configuration determining server.

(4) It has been described in the present document that the data stored in the fixed circuit waveform storage unit and the reconfigurable circuit waveform storage unit are generated by the simulation unit (not illustrated) in the configuration determining server. However, the data may be generated and stored into each storage unit by a simulation unit that is different from the configuration determining server.

(5) In the above-described embodiments, the configuration determining server includes a fixed circuit waveform storage unit, reconfigurable circuit waveform storage unit, and a measured value storage unit. However, a part or all of these storage units may be external storage device(s) connected with the configuration determining server.

(6) In the above-described embodiments, one fixed circuit unit and one reconfigurable circuit unit are implemented in an integrated circuit. However, not limited to this, a plurality of fixed circuit units and a plurality of reconfigurable circuit units may be implemented, for example.

In this case, the method for measurement for obtaining values to be used in calculation of the performance data may be determined in accordance with the arrangement of each circuit, wiring between circuits, and the size of the substrate.

For example, when circuits are almost uniformly arranged on the substrate, a circuit formed near the center of the substrate may be determined as a representative circuit, and then, when there is a signal line that is shared by all the circuits, performance data of the representative circuit is calculated according to the procedure described in Embodiment 1 or 2. Voltage drop waveforms are then estimated for each circuit based on the performance data of the representative circuit.

Also, when a plurality of circuits exist in some groups separately, or when a plurality of circuit groups operating cooperatively are formed by connections and non-connections of signal lines, measurement of values, estimation of voltage drop waveforms, and selection of configuration information may be performed for each of the groups.

(7) One example of the method for estimating voltage drop waveforms has been described with reference to FIG. 5. However, not limited to this, other methods such as the following one may be adopted. Here, one example of such will be described. Note that, although an estimation process by the fixed circuit waveform estimating unit 3013 in Embodiment 1 is explained here, it is also applicable to the estimation by the reconfigurable circuit waveform estimating unit in Embodiments 1 and 2.

The fixed circuit waveform estimating unit 3013 reads out a voltage drop waveform 1022 for a case of operation as designed, from the fixed circuit waveform storage unit 1011.

The fixed circuit waveform estimating unit 3013 extracts, from the voltage drop waveform 1022, a design target value ty of the operation time of the fixed circuit unit, and calculates an estimated operation time tk of the fixed circuit unit from the design target value ty and the performance data.

$$tk = ty \times (\text{performance data}) \quad \text{(Equation 3)}$$

It is assumed here that, as stated earlier, the time integration value of the voltage drop waveform does not change even if manufacturing conditions or operational conditions slightly change. The fixed circuit waveform estimating unit 3013 then increases and/or decreases the voltage drop waveform 1022 in the time axis direction and in the voltage drop axis direction such that the operation time is tk and the integration value of the voltage drop waveform 1023 with time is equivalent to the integration value of the voltage drop waveform 1022 with time. The waveform obtained in this way is used as the estimated waveform of the fixed circuit unit.

(8) In the above-described embodiments, a circuit structure to be built in the reconfigurable circuit unit is selected so that the maximum voltage drop amount is reduced. Further, a delay analysis may be performed, and the place and routing may be performed so that the critical path delay becomes the smallest.

(9) In the above-described embodiments and modifications, selection of the configuration information is performed by an entity (configuration determining server) outside the integrated circuit. However, not limited to this, components having a similar structure to the configuration determining server may be provided in the semiconductor integrated circuit, and the components may be used to perform the calculation of performance data, estimation of voltage drop waveforms, and selection of configuration information.

With such a structure, the integrated circuit can select configuration information by itself, which makes the operation easier. Also, the selection of configuration information may be performed only once at the beginning of operation, or may be changed during operation.

(10) In the above-described embodiments, a judgment on good/defect of the integrated circuit is made based on the size of the maximum voltage drop value. However, not limited to this, for example, the maximum electric current density of each unit in the semiconductor integrated circuit may be calculated, and then a judgment on good/defect of the integrated circuit may be made by checking whether or not each unit satisfies rules of the electric current density.

(11) In the above-described embodiments and modifications, the judging unit determines configuration information based on only the maximum voltage drop value. However, this is merely one example. For example, a threshold value may be set for the operation time that is obtained from the estimated waveform, in addition to the maximum voltage drop value, and the judging unit may output configuration information that indicates a structure where the operation time obtained from the combined waveform is smaller than the threshold value.

(12) Each of the above-described devices is specifically a computer system that includes a microprocessor, ROM, RAM, a hard disk unit, a display unit, a keyboard, a mouse and the like. A computer program is stored in the ROM, RAM, or the hard disk unit. The microprocessor operates in accordance with the computer program and causes each device to achieve the functions. The computer program is composed of a plurality of instruction codes that instruct the computer to achieve predetermined functions.

(13) Part or all of the structural elements constituting the devices described above may be implemented in one system LSI (Large Scale Integration). The system LSI is an ultra multi-functional LSI in which a plurality of components are integrated on one chip. More specifically, the system LSI is a computer system that includes a microprocessor, ROM, RAM and the like. A computer program is stored in the RAM. The microprocessor operates in accordance with the computer program, thereby enabling the system LSI to achieve its functions.

Although the term LSI is used here, it may be called IC, LSI, super LSI, ultra LSI or the like, depending on the level of integration.

It is also possible to use the FPGA (Field Programmable Gate Array), with which a programming is available after the LSI is manufactured, or the reconfigurable processor that can re-configure the connection or setting of the circuit cells within the LSI.

It is also possible to use the MEMS (Micro-Electro-Mechanical Systems).

Furthermore, a technology for an integrated circuit that replaces the LSI may appear in the near future as the semiconductor technology improves or branches into other technologies. In that case, the new technology may be incorporated into the integration of the functional blocks constituting the present invention as described above. Such possible technologies include biotechnology.

(14) Part or all of the structural elements constituting each of the above-described devices may be achieved as an IC card or a single module that is attachable/detachable to or from each device. The IC card or module is a computer system that includes a microprocessor, ROM, RAM, and the like. The IC card or module may include the aforesaid ultra multi-functional LSI. The microprocessor operates in accordance with the computer program and causes the IC card or module to achieve the functions. The IC card or module may be tamper resistant.

(16) One aspect of the present invention may be method shown by the above. Another aspect of the present invention may, be a computer program that allows a computer to realize the methods, or may be a digital signal representing the computer program.

A further aspect of the present invention may be a computer-readable storage medium such as a flexible disk, a hard disk, CD-ROM, MO, DVD, DVD-ROM, DVD RAM, BD (Blu-ray Disc), or a semiconductor memory, that stores the computer program or the digital signal. A still further aspect of the present invention may be the digital signal stored on any of the aforementioned storage mediums.

A still further aspect of the present invention may be the computer program or the digital signal transmitted via an electric communication line, a wireless or wired communication line, a network of which the Internet is representative, or a data broadcast.

A still further aspect of the present invention may be a computer system that includes a microprocessor and a memory, the memory storing the computer program, and the microprocessor operating according to the computer program.

Furthermore, by transferring the program or the digital signal via the storage medium, or by transferring the program or the digital signal via the network or the like, the program or the digital signal may be executed by another independent computer system.

(16) One aspect of the present invention is a method for designing a semiconductor integrated circuit including a programmable circuit unit and a fixed circuit unit, the method comprising the steps of: obtaining performance information of a target chip; obtaining, for each piece of configuration information of the programmable circuit unit, a maximum voltage drop amount for a case where both the programmable circuit unit and the fixed circuit unit operate, based on the performance information of the target chip and a configuration information database including configuration information of a plurality of types of the programmable circuit unit which performs a same circuit operation; and selecting configuration information of the programmable circuit unit that corresponds to a maximum voltage drop value that is for the case where both the programmable circuit unit and the fixed circuit unit operate, and that is smaller than a value which is determined when the programmable circuit unit is designed.

(17) In the above-described designing method, the performance information of the target chip may include voltage information for when the target chip operates.

(18) In the above-described designing method, the performance information of the target chip may include a voltage drop value of the fixed logical circuit unit.

(19) In the above-described designing method, the performance information of the target chip may include a delay value of a circuit for monitoring.

(20) In the above-described designing method, the performance information obtaining step may include the steps of: reconfiguring the programmable circuit unit to obtain a circuit delay value; and obtaining the circuit delay value using the programmable circuit unit being reconfigured in the reconfiguring step.

(21) In the above-described designing method, the configuration information selecting step may select a smallest maximum voltage drop value from among maximum voltage drop amounts that are smaller than a value which was determined when the fixed circuit unit was designed.

(22) Another aspect of the present invention is a semiconductor integrated circuit designed with use of the above-described designing method.

(23) A further aspect of the present invention is a wireless information device using the above-described semiconductor integrated circuit.

(24) The present invention may be any combination of the above-described embodiments and modifications.

Industrial Applicability

The present invention can be used managerially, continuously and repetitively in industries for manufacturing and selling semiconductor integrated circuits, in industries for manufacturing and selling manufacturing devices of the semiconductor integrated circuits, and in industries for manufacturing and selling devices in which the semiconductor integrated circuits are loaded.

The invention claimed is:

1. A manufacturing system comprising a semiconductor integrated circuit and a manufacturing device, the semiconductor integrated circuit being a semifinished product, the manufacturing device manufacturing a finished product by outputting appropriate configuration information to the semiconductor integrated circuit, wherein
the semiconductor integrated circuit includes a programmable circuit and a fixed circuit, and
the manufacturing device includes:
a storage unit storing a plurality of pieces of candidate configuration information and a plurality of pieces of first voltage information, where the plurality of pieces of candidate configuration information define respective configurations of a plurality of candidate circuits that have the same function but different configurations when configured in the programmable circuit, the plurality of pieces of first voltage information indicating voltage changes that are expected to arise in the programmable circuit when the plurality of candidate circuits operate respectively;
an obtaining unit operable to obtain one or more measured values of voltage changes measured in the semiconductor integrated circuit, from the semiconductor integrated circuit which is operating at least partially;
a generating unit operable to generate, based on the obtained measured values, second voltage information that indicates a voltage change that arises in the fixed circuit as the fixed circuit operates;
a calculating unit operable to obtain, by combining the second voltage information and each of the plurality of pieces of first voltage information for each of the plurality of candidate circuits, third voltage information that indicates a change in a voltage drop value, the voltage drop value being a difference between a designed reference voltage and a voltage that arises in the semiconductor integrated circuit when both the fixed circuit and the programmable circuit operate, and calculate a maximum voltage drop value from the obtained third voltage information;
a selecting unit operable to detect one or more candidate circuits corresponding to maximum voltage drop values that are smaller than a threshold value, and select, as output configuration information, one among one or more pieces of candidate configuration information defining configurations of the detected candidate circuits; and
an output unit operable to output the selected output configuration information to the semiconductor integrated circuit.

2. The manufacturing system of claim 1, wherein
the obtaining unit obtains, as the one or more measured values, a plurality of voltage values that were measured at prescribed intervals in the semiconductor integrated circuit in operation, and
the generating unit generates the second voltage information by complementing between the obtained plurality of voltage values.

3. The manufacturing system of claim 1, wherein
the obtaining unit obtains, as the one or more measured values, operation times that were measured in the semiconductor integrated circuit in operation, and
the generating unit includes:
a storage unit storing first prediction information indicating a voltage change that is expected to arise in the fixed circuit when the fixed circuit operates with a first operation time, and second prediction information indicating a voltage change that is expected to arise in the fixed circuit when the fixed circuit operates with a second operation time; and
an information generating unit operable to generate the second voltage information by complementing between the first prediction information and the second prediction information, using the obtained operation times.

4. The manufacturing system of claim 1, wherein
the obtaining unit obtains, as the one or more measured values, a plurality of voltage drop values that were measured at prescribed intervals in the semiconductor integrated circuit in operation and that indicate drops from the reference voltage, and
the generating unit generates the second voltage information by complementing between the obtained plurality of voltage drop values.

5. The manufacturing system of claim 1 further comprising:
a prediction information storage unit storing, for one of the candidate circuits, first prediction information indicating a voltage change with time that is expected to arise in the programmable circuit when the one of the candidate circuits operates with a first operation time;
a prediction information generating unit operable to generate second prediction information indicating a voltage change when the one of the candidate circuits operates with a second operation time, by increasing and/or decreasing the first prediction information in a time axis direction and in a voltage change axis direction, using the first operation time;
a voltage information generating unit operable to generate the first voltage information by complementing between the first prediction information and the second prediction information, using the obtained measured values; and
a recording unit operable to record the first voltage information into the storage unit.

6. The manufacturing system of claim 5, wherein
the prediction information generating unit generates the second prediction information so that an integration value for entire prediction interval of the first prediction information corresponds to an integration value for entire prediction interval of the second prediction information.

7. The manufacturing system of claim 1, wherein
when there are a plurality of candidate circuits corresponding to maximum voltage drop values that are smaller than a threshold value, the selecting unit selects, as the output configuration information, one of the one or more pieces of candidate configuration information that corresponds to the smallest one among the maximum voltage drop values.

8. A manufacturing device for manufacturing a finished product by outputting appropriate configuration information to a semiconductor integrated circuit which is a semifinished product including a programmable circuit and a fixed circuit, the manufacturing device comprising:
a storage unit storing a plurality of pieces of candidate configuration information and a plurality of pieces of first voltage information, where the plurality of pieces of candidate configuration information define respective configurations of a plurality of candidate circuits that have the same function but different configurations when configured in the programmable circuit, the plurality of pieces of first voltage information indicating voltage changes that are expected to arise in the programmable circuit when the plurality of candidate circuits operate respectively;
an obtaining unit operable to obtain one or more measured values of voltage changes measured in the semiconductor integrated circuit, from the semiconductor integrated circuit which is operating at least partially;
a generating unit operable to generate, based on the obtained measured values, second voltage information that indicates a voltage change that arises in the fixed circuit as the fixed circuit operates;
a calculating unit operable to obtain, by combining the second voltage information and each of the plurality of pieces of first voltage information for each of the plurality of candidate circuits, third voltage information that indicates a change in a voltage drop value, the voltage drop value being a difference between a designed reference voltage and a voltage that arises in the semiconductor integrated circuit when both the fixed circuit and the programmable circuit operate, and calculate a maximum voltage drop value from the obtained third voltage information;
a selecting unit operable to detect one or more candidate circuits corresponding to maximum voltage drop values that are smaller than a threshold value, and select, as output configuration information, one among one or more pieces of candidate configuration information defining configurations of the detected candidate circuits; and
an output unit operable to output the selected output configuration information to the semiconductor integrated circuit.

9. A manufacturing method for use in a manufacturing device for manufacturing a finished product by outputting appropriate configuration information to a semiconductor integrated circuit which is a semifinished product including a programmable circuit and a fixed circuit, the manufacturing method comprising the steps of:
obtaining a plurality of pieces of candidate configuration information and a plurality of pieces of first voltage information, where the plurality of pieces of candidate configuration information define respective configurations of a plurality of candidate circuits that have the same function but different configurations when configured in the programmable circuit, the plurality of pieces of first voltage information indicating voltage changes that are expected to arise in the programmable circuit when the plurality of candidate circuits operate respectively;
obtaining one or more measured values of voltage changes measured in the semiconductor integrated circuit, from the semiconductor integrated circuit which is operating at least partially;
generating, based on the obtained measured values, second voltage information that indicates a voltage change that arises in the fixed circuit as the fixed circuit operates;
obtaining, by combining the second voltage information and each of the plurality of pieces of first voltage information for each of the plurality of candidate circuits, third voltage information that indicates a change in a voltage drop value; the voltage drop value being a difference between a designed reference voltage and a voltage that arises in the semiconductor integrated circuit when both the fixed circuit and the programmable circuit operate, and calculate a maximum voltage drop value from the obtained third voltage information;
detecting one or more candidate circuits corresponding to maximum voltage drop values that are smaller than a threshold value, and select, as output configuration information, one among one or more pieces of candidate configuration information defining configurations of the detected candidate circuits; and
outputting the selected output configuration information to the semiconductor integrated circuit.

10. A semiconductor integrated circuit comprising a programmable circuit and a fixed circuit, the semiconductor integrated circuit being manufactured through the steps of:
obtaining a plurality of pieces of candidate configuration information and a plurality of pieces of first voltage information, where the plurality of pieces of candidate configuration information define respective configurations of a plurality of candidate circuits that have the same function but different configurations when configured in the programmable circuit, the plurality of pieces of first voltage information indicating voltage changes that are expected to arise in the programmable circuit when the plurality of candidate circuits operate respectively;

obtaining one or more measured values of voltage changes measured in the semiconductor integrated circuit, from the semiconductor integrated circuit which is operating at least partially;

generating, based on the obtained measured values, second voltage information that indicates a voltage change that arises in the fixed circuit as the fixed circuit operates;

obtaining, by combining the second voltage information and each of the plurality of pieces of first voltage information for each of the plurality of candidate circuits, third voltage information that indicates a change in a voltage drop value, the voltage drop value being a difference between a designed reference voltage and a voltage that arises in the semiconductor integrated circuit when both the fixed circuit and the programmable circuit operate, and calculate a maximum voltage drop value from the obtained third voltage information;

detecting one or more candidate circuits corresponding to maximum voltage drop values that are smaller than a threshold value, and select, as output configuration information, one among one or more pieces of candidate configuration information defining configurations of the detected candidate circuits; and outputting the selected output configuration information to the semiconductor integrated circuit.

11. A communication system comprising an information terminal device and a server device, wherein the information terminal device includes:

a first communication unit;

a semiconductor integrated circuit including a programmable circuit and a fixed circuit; and a writing unit operable to receive configuration information via the first communication unit, and write the received configuration information into the programmable circuit, and the server device includes:

a second communication unit;

a storage unit storing a plurality of pieces of candidate configuration information and a plurality of pieces of first voltage information, where the plurality of pieces of candidate configuration information define respective configurations of a plurality of candidate circuits that have the same function but different configurations when configured in the programmable circuit, the plurality of pieces of first voltage information indicating voltage changes that are expected to arise in the programmable circuit when the plurality of candidate circuits operate respectively;

an obtaining unit operable to, in the information terminal device which is operating at least partially, obtain, from the semiconductor integrated circuit in operation via the second communication unit, one or more measured values of voltage changes measured in the semiconductor integrated circuit;

a generating unit operable to generate, based on the obtained measured values, second voltage information that indicates a voltage change that arises in the fixed circuit as the fixed circuit operates;

a calculating unit operable to obtain, by combining the second voltage information and each of the plurality of pieces of first voltage information for each of the plurality of candidate circuits, third voltage information that indicates a change in a voltage drop value, the voltage drop value being a difference between a designed reference voltage and a voltage that arises in the semiconductor integrated circuit when both the fixed circuit and the programmable circuit operate, and calculate a maximum voltage drop value from the obtained third voltage information;

a selecting unit operable to detect one or more candidate circuits corresponding to maximum voltage drop values that are smaller than a threshold value, and select, as output configuration information, one among one or more pieces of candidate configuration information defining configurations of the detected candidate circuits; and an output unit operable to output the selected output configuration information to the semiconductor integrated circuit.

* * * * *